United States Patent
Baba et al.

(10) Patent No.: US 9,947,979 B2
(45) Date of Patent: Apr. 17, 2018

(54) HIGH-FREQUENCY FILTER AND ELECTRONIC DEVICE

(71) Applicant: Murata Manufacturing Co., Ltd., Nagaokakyo-shi, Kyoto-fu (JP)

(72) Inventors: Takahiro Baba, Nagaokakyo (JP); Yasuko Yoshinaga, Nagaokakyo (JP); Satoshi Ishino, Nagaokakyo (JP); Jun Sasaki, Nagaokakyo (JP); Noboru Kato, Nagaokakyo (JP); Kuniaki Yosui, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/393,301

(22) Filed: Dec. 29, 2016

(65) Prior Publication Data
US 2017/0110777 A1   Apr. 20, 2017

Related U.S. Application Data

(63) Continuation of application No. 14/802,059, filed on Jul. 17, 2015, now Pat. No. 9,570,784, which is a (Continued)

(30) Foreign Application Priority Data

Feb. 1, 2013   (JP) ................................ 2013-018772
Apr. 9, 2013   (JP) ................................ 2013-080953
Jun. 19, 2013  (JP) ................................ 2013-128826

(51) Int. Cl.
*H01P 1/20*    (2006.01)
*H01P 5/12*    (2006.01)
(Continued)

(52) U.S. Cl.
CPC .......... *H01P 1/2013* (2013.01); *H05K 1/0243* (2013.01)

(58) Field of Classification Search
CPC ... H01L 21/4857; H01L 23/66; H05K 1/0298; H05K 1/0393; H05K 1/147;
(Continued)

(56) References Cited

U.S. PATENT DOCUMENTS 5,175,518 A * 12/1992 Swanson, Jr. ........ H03H 7/0115
                                                                333/168
5,525,953 A *  6/1996 Okada ................... H01P 1/2039
                                                                333/204
(Continued)

OTHER PUBLICATIONS

Baba et al., "Flat Cable High-Frequency Filter, Flat Cable High-Frequency Diplexer, and Electronic Device", U.S. Appl. No. 14/802,059, filed Jul. 17, 2015.

*Primary Examiner* — Dean Takaoka
*Assistant Examiner* — Alan Wong
(74) *Attorney, Agent, or Firm* — Keating & Bennett, LLP

(57) ABSTRACT

A flat cable high-frequency filter includes a dielectric substrate extending in a transmission direction of a high-frequency signal. The dielectric substrate includes dielectric layers stacked on each other. Elongated conductor patterns are provided on a flat surface of one dielectric layer which faces another dielectric layer. The conductor patterns are as wide as possible in the dielectric substrate in accordance with a desired inductance. A capacitive coupling conductor pattern opposes one conductor pattern by a predetermined area with a dielectric layer therebetween. By using a connecting conductor, the capacitive coupling conductor pattern is connected to the conductor pattern which does not oppose the capacitive coupling conductor pattern.

19 Claims, 27 Drawing Sheets

Related U.S. Application Data continuation of application No. PCT/JP2014/050494, filed on Jan. 15, 2014.

(51) Int. Cl.
*H05K 1/02* (2006.01)
*H01P 1/201* (2006.01)

(58) Field of Classification Search
CPC ... H05K 2201/0141; H01P 1/201; H01P 5/12; H03H 1/00; H03H 2001/0021
See application file for complete search history.

(56) References Cited

U.S. PATENT DOCUMENTS

| | | | |
|---|---|---|---|
| 6,995,632 B2* | 2/2006 | Saito | H01P 1/203 333/175 |
| 7,777,588 B2* | 8/2010 | Gleich | G01R 33/287 333/24 R |
| 9,401,531 B2* | 7/2016 | Iida | H01P 3/08 |
| 9,401,534 B2* | 7/2016 | Kato | H01P 3/08 |
| 9,444,126 B2* | 9/2016 | Kato | H01P 3/003 |
| 9,570,784 B2* | 2/2017 | Baba | H01P 1/20345 |

* cited by examiner

HIGH-FREQUENCY FILTER AND ELECTRONIC DEVICE

BACKGROUND OF THE INVENTION

1. Field of the Invention

The present invention relates to a flat cable high-frequency filter and a flat cable high-frequency diplexer, each of which is a thin, flat film and has a frequency selection function, and an electronic device including the flat cable high-frequency filter or the flat cable high-frequency diplexer.

2. Description of the Related Art

Hitherto, an electronic device using high-frequency signals, such as a mobile terminal, includes a high-frequency filter for separating a high-frequency signal in a desired frequency band from unwanted high-frequency signals and harmonic signals.

The structure of a known high-frequency filter is, for example, the structure disclosed in Japanese Unexamined Patent Application Publication No. 2002-57543. The high-frequency filter disclosed in this publication is constituted by a mounting multilayer body obtained by stacking a plurality of dielectric layers and by sintering them. Inductors and capacitors forming the high-frequency filter are implemented by conductor patterns formed within the multilayer body.

In accordance with a reduced size of an electronic device, the mount area for a high-frequency filter constituted by the above-described mounting multilayer body is more and more restricted. It is thus demanded that the size of a high-frequency filter be also reduced. In this case, the size and the thickness of conductor patterns formed within the multilayer body forming inductors and capacitors are also decreased.

However, if the size of a mounting high-frequency filter is reduced, the device characteristics of inductors and capacitors are decreased. For example, concerning inductors, the equivalent series resistance (ESR) is increased due to a decrease in the thickness of the inductors. Concerning capacitors, the equivalent series inductance (ESL) is increased due to a complicated wiring pattern for forming a high-frequency filter. Because of the decreased device characteristics, the Q factor of the high-frequency filter is reduced, thus increasing the loss in the high-frequency filter.

When connecting a high-frequency filter between circuits on a plurality of mount boards, one of the following structures is employed for the above-described known mounting high-frequency filter. The high-frequency filter is mounted on one mount board and is connected to the other mount board by using a flat cable. Alternatively, an intermediate mount board is disposed between two mount boards, and a high-frequency filter is mounted on this intermediate mount board and is connected to the two mount boards by using flat cables.

With the above-described structures, transmission loss occurs in the individual flat cables, and thus, in addition to the loss in the above-described high-frequency filter, transmission loss is also incurred.

A mounting multilayer body forming a high-frequency filter requires a certain height. Accordingly, a space is required on the mount surface of a mount board in accordance with the height of the multilayer body.

SUMMARY OF THE INVENTION

Preferred embodiments of the present invention provide a space-saving high-frequency filter having small-loss transmission characteristics.

A flat cable high-frequency filter according to a preferred embodiment of the present invention includes a dielectric substrate, a plurality of conductor patterns, and a capacitive coupling conductor pattern. The dielectric substrate is a flat film and extends in a transmission direction of a high-frequency signal. The plurality of conductor patterns are provided in the dielectric substrate, extend along an extending direction of the dielectric substrate, and are separated from each other at a position between two ends of the extending direction of the dielectric substrate. The capacitive coupling conductor pattern capacitively couples the plurality of conductor patterns. In this flat cable high-frequency filter, the plurality of conductor patterns define inductors, and the capacitive coupling conductor pattern defines a capacitor.

With this configuration, an LC series resonance circuit of inductors and a capacitor is defined by the conductor patterns formed in the flat-film dielectric substrate. A high-frequency filter is implemented by this LC series resonance circuit.

In the flat cable high-frequency filter, the dielectric substrate may preferably have a dielectric loss tangent equal to or smaller than about 0.005, for example.

With this configuration, the Q factor of the LC series resonance circuit, that is, the high-frequency filter, is improved. It is thus possible to implement a flat cable high-frequency filter exhibiting higher transmission characteristics.

In the flat cable high-frequency filter, the dielectric substrate may preferably be made of a liquid crystal polymer.

With this configuration, it is possible to implement a thin dielectric substrate having high flexibility while exhibiting a small dielectric loss tangent.

In the flat cable high-frequency filter, a conductor pattern connected to a ground potential preferably may not be formed in the dielectric substrate.

With this configuration, a stray capacitance is not generated between a conductor pattern and a ground, thus obtaining even higher filter characteristics and transmission characteristics.

The flat cable high-frequency filter may further include a shield conductor pattern that is a flat film and that opposes flat film surfaces of the plurality of conductor patterns which do not define the capacitor with a predetermined distance therebetween.

With this configuration, in a region in which the inductor is located, it is possible to significantly reduce or prevent electromagnetic interference of the conductor patterns with the outside. In a region in which the capacitor is located, it is possible to obtain a desired capacitance with high precision.

In the flat cable high-frequency filter, the shield conductor pattern may preferably be disposed opposing each of both surfaces of a conductor pattern so as to sandwich the conductor pattern therebetween.

With this configuration, interference of the conductor patterns with the outside is further significantly reduced or prevented.

In the flat cable high-frequency filter, a bent portion may preferably be located at a position other than a region in which the capacitive coupling conductor pattern is formed along the transmission direction of the dielectric substrate.

In this configuration, even if the flat cable high-frequency filter is bent and disposed, the capacitor forming region is not bent. Accordingly, the capacitance is not changed, and thus, the characteristics of the flat cable high-frequency filter are not changed.

In the flat cable high-frequency filter, the capacitive coupling conductor pattern may be constituted by a flat conductor pattern which is disposed opposing a certain one of the plurality of conductor patterns with a dielectric layer forming the dielectric substrate therebetween and a flat region of the certain one of the plurality of conductor patterns which opposes the flat conductor pattern.

In the flat cable high-frequency filter, the capacitive coupling conductor pattern may be constituted by a flat conductor pattern which is disposed opposing the plurality of conductor patterns with a dielectric layer defining the dielectric substrate therebetween and flat regions of the plurality of conductor patterns which oppose the flat conductor pattern.

In the flat cable high-frequency filter, the plurality of conductor patterns may be provided on different surfaces with a dielectric layer defining the dielectric substrate therebetween. The capacitive coupling conductor pattern may be constituted by a region by which the plurality of conductor patterns oppose each other with the dielectric layer therebetween.

In the above-described structures, the specific configuration of the capacitor forming region is indicated. The capacitance is determined by the thickness of the dielectric layer and the area of the opposing surfaces of the conductor patterns parallel with the flat surface of the dielectric layer. With this arrangement, a comparatively high capacitance is obtained.

In the flat cable high-frequency filter, a width, which is in a direction perpendicular to the transmission direction, of a conductor pattern which opposes the capacitive coupling conductor pattern may preferably be the same or substantially the same as the width of a conductor pattern which does not oppose the capacitive coupling conductor pattern.

With this configuration, the ESR of the inductor is reduced to a minimal level. This makes it possible to further improve the band pass characteristics and the transmission characteristics of the high-frequency filter.

In the flat cable high-frequency filter, the widths of the conductor patterns may preferably be substantially the same as a width of the dielectric substrate.

With this configuration, the ESR is reduced to a minimal level while maintaining the environmental resistance of the conductor patterns.

In the flat cable high-frequency filter, the capacitive coupling conductor pattern may be constituted by interdigital conductors which are integrally provided at opposing end portions of the plurality of conductor patterns and which oppose each other by a predetermined distance along the transmission direction.

With this configuration, by the use of a single layer on which the conductor patterns are provided, it is possible to implement a high-frequency filter including an LC series resonance circuit constituted by an inductor and a capacitor. It is thus possible to make the flat cable high-frequency filter even thinner.

The flat cable high-frequency filter may be configured as follows. The conductor pattern may be constituted by a first partial conductor pattern and a second partial conductor pattern, one end of the first partial conductor pattern and one end of the second partial conductor pattern being connected to each other. The first partial conductor pattern may be wider than the second partial conductor pattern and may be linearly configured along the transmission direction. The second partial conductor pattern may be configured substantially in a loop shape. The first partial conductor pattern may define the capacitor, and the second partial conductor pattern may define the inductor.

With this configuration, by using a flat cable, a high-frequency filter having desired characteristics is implemented.

In the flat cable high-frequency filter, the first partial conductor pattern and the second partial conductor pattern may be provided on a plurality of dielectric layers forming the dielectric substrate.

With this configuration, the ESR of the inductor is significantly reduced, and the capacitance of the capacitor is increased.

A flat cable high-frequency diplexer according to a preferred embodiment of the present invention includes a band pass filter configured as the above-described flat cable high-frequency filter, and a band elimination filter constituted by another conductor pattern disposed in the dielectric substrate.

With this configuration, it is possible to provide a thin diplexer exhibiting high transmission characteristics.

An electronic device according to a preferred embodiment of the present invention includes one of the above-described flat cable high-frequency filters or the flat cable high-frequency diplexer and a plurality of mount circuit members. The plurality of mount circuit members are connected to each other by the flat cable high-frequency filter or the flat cable high-frequency diplexer.

With this configuration, even if the flat cable high-frequency filter or the flat cable high-frequency diplexer is connected between the plurality of mount circuit members, it is possible to reduce the size of the entire electronic device and to suppress transmission loss incurred in the plurality of mount circuit members while maintaining the transmission characteristics of the high-frequency filter or the high-frequency diplexer.

In the electronic device, the flat cable high-frequency filter or the flat cable high-frequency diplexer may be disposed with a predetermined gap from each of the plurality of mount circuit members.

With this configuration, it is possible to significantly reduce or prevent electromagnetic interference between each of the mount circuit members and the flat cable high-frequency filter or the flat cable high-frequency diplexer.

According to a preferred embodiment of the present invention, it is possible to implement a space-saving high-frequency filter having small-loss transmission characteristics.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
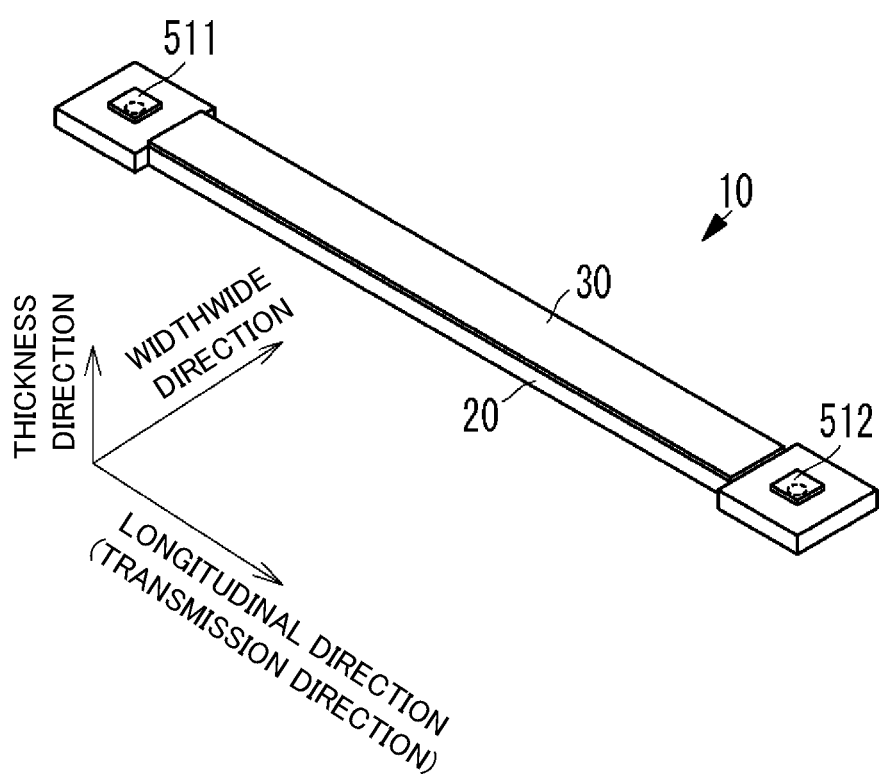
FIG. 1 is an external perspective view of a flat cable high-frequency filter according to a first preferred embodiment of the present invention.
Figure 2:
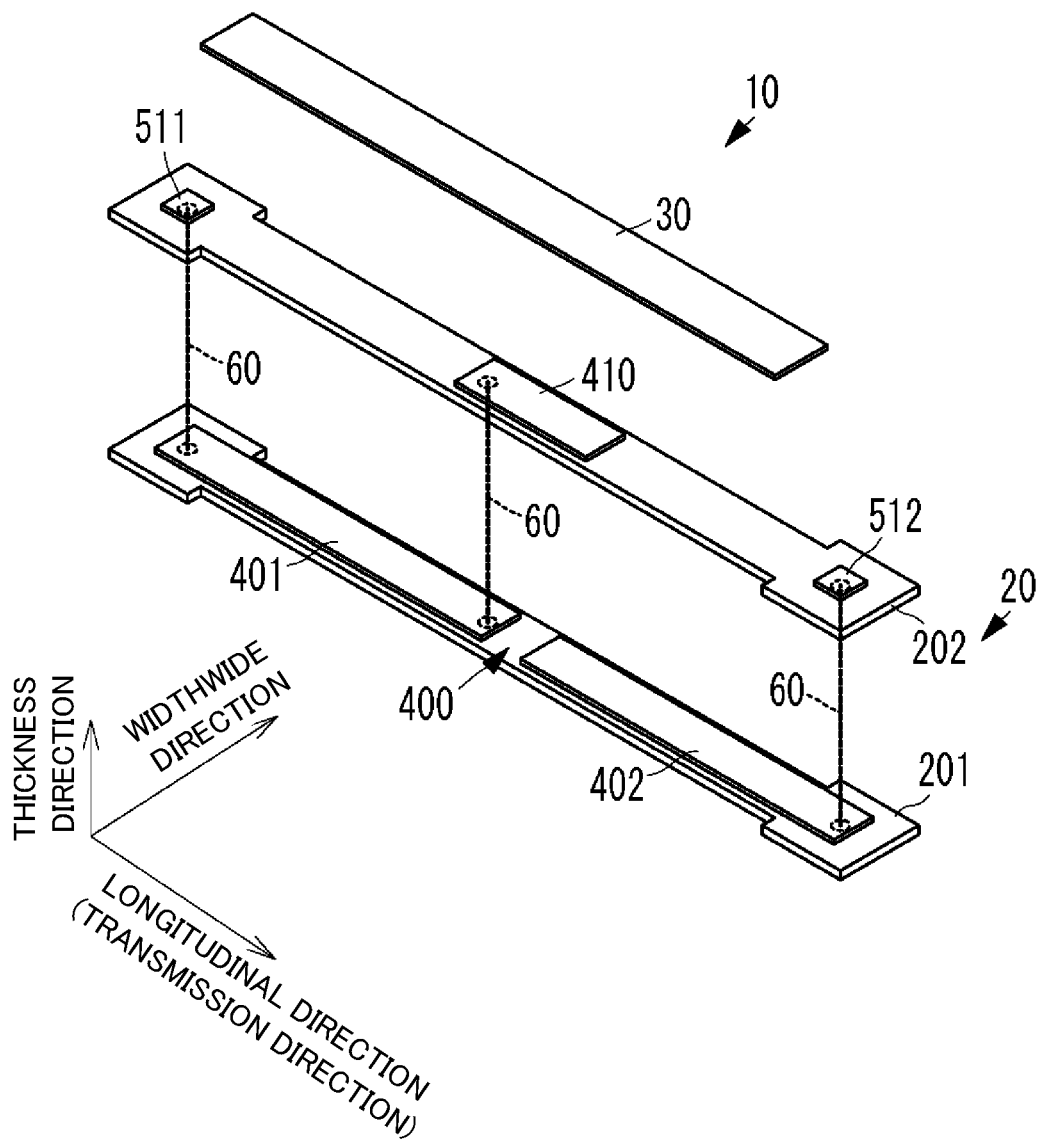
FIG. 2 is an exploded perspective view of the flat cable high-frequency filter according to the first preferred embodiment of the present invention.
Figure 3:
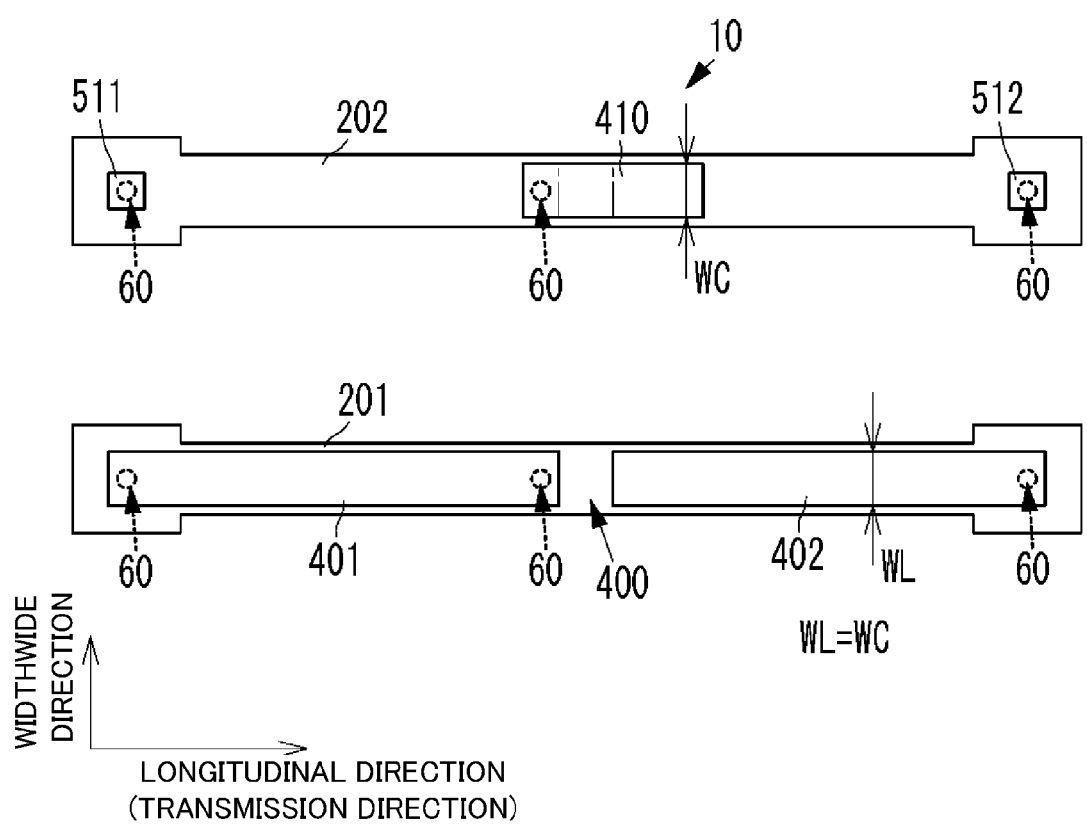
FIG. 3 is an exploded plan view of the flat cable high-frequency filter according to the first preferred embodiment of the present invention.
Figure 4:
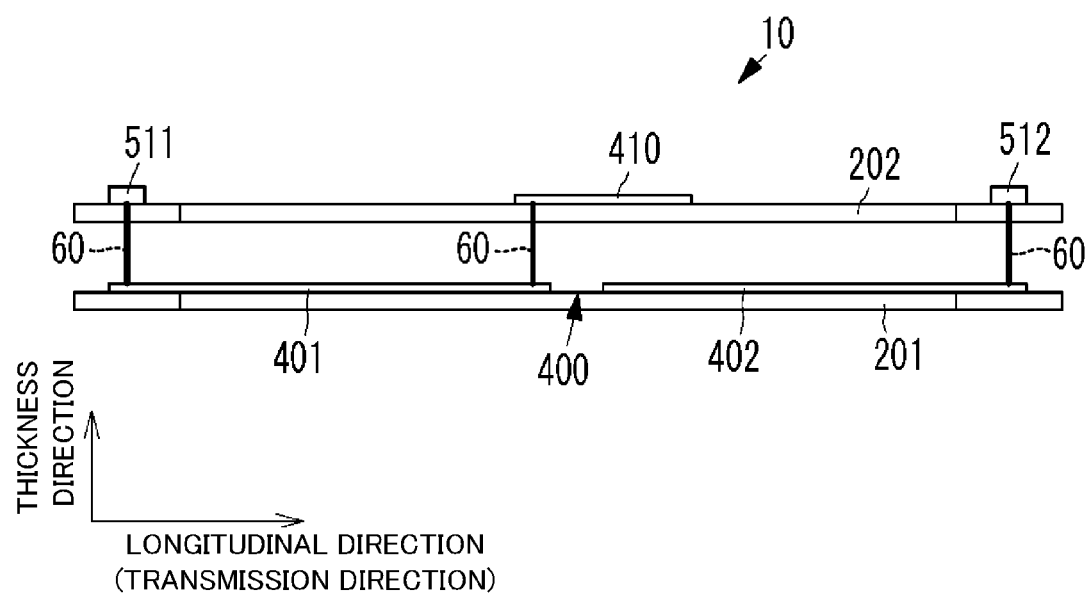
FIG. 4 is an exploded side view of the flat cable high-frequency filter according to the first preferred embodiment of the present invention.

A flat cable high-frequency filter 10 according to a first preferred embodiment of the invention will be described below with reference to FIGS. 1 through 7. FIG. 1 is an external perspective view of the flat cable high-frequency filter 10 of the first preferred embodiment. FIG. 2 is an exploded perspective view of the flat cable high-frequency filter 10 of the first preferred embodiment. FIG. 3 is an exploded plan view of the flat cable high-frequency filter 10 of the first preferred embodiment. FIG. 4 is an exploded side view of the flat cable high-frequency filter 10 of the first preferred embodiment.

As shown in FIG. 1, the flat cable high-frequency filter 10 (hereinafter may also be simply referred to as the "high-frequency filter 10") includes a dielectric substrate 20, a protecting layer 30 having insulating characteristics, and external connection conductors 511 and 512. On one principal surface of the dielectric substrate 20, the external connection conductors 511 and 512 and the protecting layer 30 are disposed. The protecting layer 30 is disposed such that the external connection conductors 511 and 512 project from the protecting layer 30 and it covers a capacitive coupling conductor pattern 410, which will be discussed later.

The dielectric substrate 20 is constituted by an elongated flat film extending in the transmission direction of high-frequency signals and has a predetermined thickness. The extending direction of the dielectric layer 20 is a longitudinal direction, and a direction perpendicular to the longitudinal direction and the thickness direction is a widthwise direction.

As shown in FIGS. 2, 3, and 4, the dielectric substrate 20 is constituted by flat, thin dielectric layers 201 and 202 (for example, having a thickness of about 25 μm to about 50 μm) stacked on each other in the thickness direction. The dielectric substrate 20 (dielectric layers 201 and 202) is made of a dielectric having a small dielectric loss tangent (tan δ). More preferably, the dielectric substrate 20 (dielectric layers 201 and 202) is preferably made of a material having a dielectric loss tangent equal to or smaller than about 0.005, for example. More specifically, a liquid crystal polymer may be used for the dielectric substrate 20.

Conductor patterns 401 and 402 are provided on the flat surface of the dielectric layer 201 which faces the dielectric layer 202. The conductor patterns 401 and 402 are made of a material having a high conductivity, for example, copper (Cu). In the first preferred embodiment, copper foil having a thickness of about 10 μm to about 20 μm preferably is used, for example.

The conductor patterns 401 and 402 preferably have an elongated shape. The longitudinal direction of the conductor patterns 401 and 402 is the same as that of the dielectric substrate 20. The conductor pattern 401 extends from an area near one end of the dielectric layer 201 to about a midpoint of the longitudinal direction thereof, while the conductor pattern 402 extends from an area near the other end of the dielectric layer 201 to about a midpoint of the longitudinal direction thereof. The conductor patterns 401 and 402 are not connected to each other. A gap 400 is provided between the opposing end portions of the conductor patterns 401 and 402. The length (length in the longitudinal direction) of the conductor patterns 401 and 402 is determined so as to satisfy a desired inductance of the high-frequency filter 10 as an inductor.

The width of the conductor patterns 401 and 402 is preferably as close as that of the dielectric substrate 20. In other words, the conductor patterns 401 and 402 are preferably as wide as possible within a range in which they can be formed in the dielectric substrate 20. However, a suitable width of the conductor patterns 401 and 402 may be set so as to satisfy a desired inductance of the high-frequency filter 10 as an inductor. For example, the width of the conductor patterns 401 and 402 is preferably about 80% or higher, and more particularly, about 90% of that of the dielectric substrate 20. That is, the width of the conductor patterns 401 and 402 is preferably the same or substantially the same as that of the dielectric substrate 20. With this configuration, the ESR is reduced to a minimal level while maintaining the environmental resistance of the conductor patterns 401 and 402.

The capacitive coupling conductor pattern 410 is provided on the flat surface of the dielectric layer 202 which does not face the dielectric layer 201. The capacitive coupling conductor pattern 410, as well as the conductor patterns 401 and 402, is made of a material having a high conductivity, for example, copper (Cu). In the first preferred embodiment, copper foil having a thickness of about 10 μm to about 20 μm preferably is used, for example. The capacitive coupling conductor pattern 410 preferably has an elongated shape. The capacitive coupling conductor pattern 410 opposes, with the intervening dielectric layer 202, a region near the end portions of the conductor patterns 401 and 402 which oppose each other with the gap 400 therebetween. In this case, the area by which the capacitive coupling conductor pattern 410 opposes the conductor pattern 402 is determined so as to satisfy a desired capacitance of the high-frequency filter 10 as a capacitor.

The capacitive coupling conductor pattern 410 opposes the conductor pattern 401 by an area in which a connecting conductor 60 constituted by a conductive-via passing through the dielectric layer 202 is provided. The capacitive coupling conductor pattern 410 is connected to the conductor pattern 401 via the connecting conductor 60.

The external connection conductor 511 is provided at one end of the flat surface of the dielectric layer 202 which does not face the dielectric layer 201. The shape of the external connection conductor 511 is square or substantially square. The external connection conductor 511 is made of a material having a high conductivity, for example, copper (Cu). In the first preferred embodiment, copper foil having a thickness of about 10 μm to about 20 μm preferably is used, for example. The external connection conductor 511 is connected to a region near one end portion of the conductor pattern 401 which does not face the conductor pattern 402 via the connecting conductor 60 passing through the dielectric layer 202.

The external connection conductor 512 is provided at the other end of the flat surface of the dielectric layer 202 which does not face the dielectric layer 201. The shape of the external connection conductor 512 is square or substantially square. The external connection conductor 512 is made of a material having a high conductivity, for example, copper (Cu). The external connection conductor 512 is connected to a region near an end portion of the conductor pattern 402 which does not face the conductor pattern 401 via a connecting conductor 60 passing through the dielectric layer 202.

With this configuration of the high-frequency filter 10, a high-frequency signal input from the external connection conductor 511 is transmitted to the capacitive coupling conductor pattern 410 via the conductor pattern 401. Then, the high-frequency signal is transmitted to the conductor pattern 402 due to capacitive coupling between the capacitive coupling conductor pattern 410 and the conductor pattern 402 and is output from the external connection conductor 512.

Figure 5A:
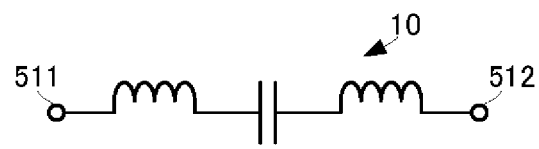
FIG. 5A is an equivalent circuit diagram of the flat cable high-frequency filter according to the first preferred embodiment of the present invention.

With the configuration of the high-frequency filter 10, the conductor patterns 401 and 402 define and function as inductors, and the portion by which the capacitive coupling conductor pattern 410 opposes the conductor pattern 402 with the dielectric layer 202 therebetween defines and functions as a capacitor. FIG. 5A is an equivalent circuit diagram of the flat cable high-frequency filter 10 of the first preferred embodiment. With the above-described configuration of the high-frequency filter 10, as shown in FIG. 5A, an LC series resonance circuit constituted by an inductor, a capacitor, and an inductor connected in series with each other in this order is formed between the external connection conductors 511 and 512. In this case, as discussed above, by suitably determining the configurations of the conductor patterns 401 and 402 and the configuration of the capacitive coupling conductor pattern 410, the inductance of each inductor and the capacitance of the capacitor can be set to be desired values. It is thus possible to implement a filter in which a desired frequency range is set to be a passband and the frequency ranges outside of the passband are set to be attenuation bands.

With the configuration of the first preferred embodiment, the conductor patterns 401 and 402 defining and functioning as inductors may be wider than those forming inductors disposed in a known mounting multilayer body, thus reducing the ESR of the inductors. It is thus possible to improve the Q factor of the high-frequency filter 10 and to reduce transmission loss.

It is also possible to increase the area by which the capacitive coupling conductor pattern 410 opposes the conductor pattern 402. A high capacitance is obtained without changing the external configuration of the flat cable high-frequency filter 10. Accordingly, the range of capacitance values necessary as a high-frequency filter is increased, and thus, desired characteristics of a high-frequency filter are also likely to be implemented.

With the configuration of the first preferred embodiment, a routing conductor connecting an inductor and a capacitor, which is used in a known mounting multilayer body, is not required. Thus, unwanted inductance components connected to a capacitor are not generated, thus further improving the Q factor of the high-frequency filter 10 and reducing transmission loss.

As discussed above, a material having a very small dielectric loss tangent (tan δ) (more specifically, for example, tan δ≤0.005) is preferably used for the dielectric substrate 20. It is thus possible to further improve the Q factor of the high-frequency filter 10 and to reduce transmission loss. In particular, by using a liquid crystal polymer for the dielectric substrate 20, it is possible to implement a high-frequency filter having a high flexibility while implementing the above-described characteristics.

In the configuration of this preferred embodiment, a ground conductor is not used, thus preventing the conductor patterns 401 and 402 and the capacitive coupling conductor pattern 410 from being coupled to a ground. Thus, a stray capacitance is not generated, and a desired Q factor is obtained. It is thus possible to implement a high-frequency filter with higher precision and excellent filter characteristics.

Figure 5B:
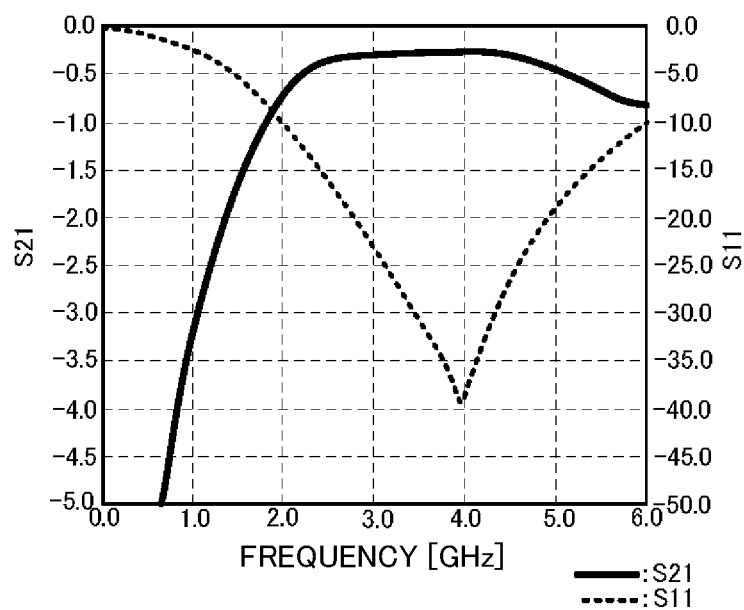
FIG. 5B is a graph illustrating filter characteristics of the flat cable high-frequency filter according to the first preferred embodiment of the present invention.

FIG. 5B is a graph illustrating filter characteristics of the flat cable high-frequency filter 10 of the first preferred embodiment. The filter characteristics shown in FIG. 5B are simulation results obtained by using S parameters (S11 and S21). In this simulation, assuming that the high-frequency filter 10 is used for Wi-Fi, the conductor patterns 401 and 402 and the capacitive coupling conductor pattern 410 are configured so that a frequency band of about 2.4 to 5.0 GHz may be set to be the passband and a frequency band (for example, a 700 MHz band) lower than the passband may be contained within the elimination band.

As shown in FIG. 5B, with the configuration of the first preferred embodiment, high-frequency signals of about a 2.4 to 5.0 GHz band can pass through the high-frequency filter 10 with a small transmission loss, and high-frequency signals of frequency bands outside of the passband can be attenuated. In particular, it is possible to significantly attenuate high-frequency signals in a lower frequency band than the passband.

As is seen from the foregoing description, with the configuration of the first preferred embodiment, it is possible to implement a thin, space-saving high-frequency filter having high filter characteristics with small transmission loss.

In the first preferred embodiment, the width WC of the capacitive coupling conductor pattern 410 and the width WL of the conductor patterns 401 and 402 are the same. However, it is sufficient that the width WC and the width WL be substantially the same. With this configuration, the conductor patterns 401 and 402 defining and functioning as inductors are able to be formed wide. This makes it possible to reduce the ESR of the inductors and to increase the Q factor of the high-frequency filter 10. The ratio of the width WL of the conductor patterns 401 and 402 to the width WC of the capacitive coupling conductor pattern 410 is preferably a ratio represented by, for example, $1.0 \geq WL/WC \geq 0.8$.

Figure 6A:
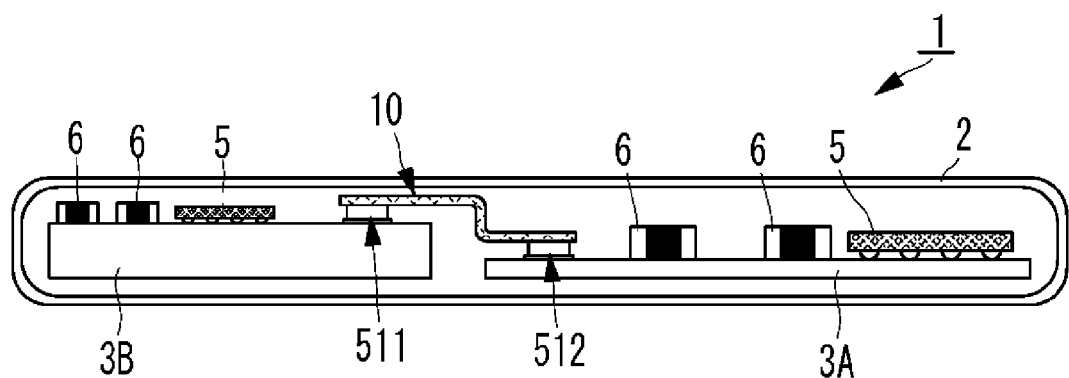
FIGS. 6A and 6B are respectively a side sectional view and a plan sectional view of the arrangement of components forming a mobile electronic device according to the first preferred embodiment of the present invention.
Figure 6B:
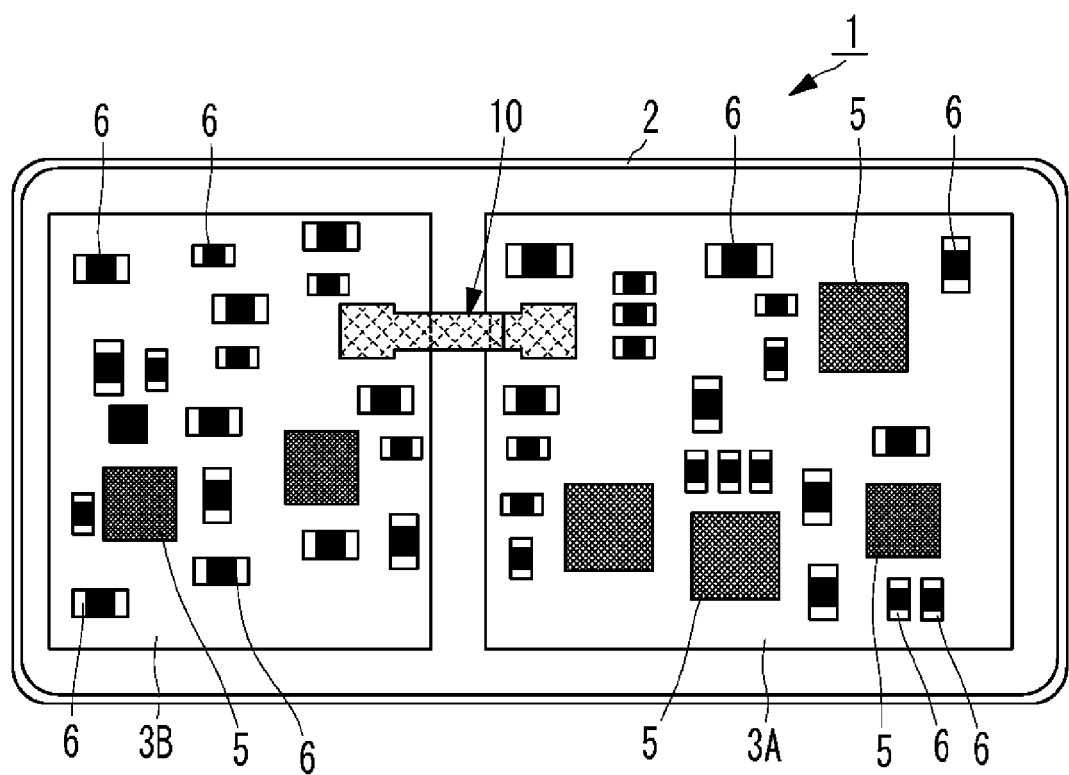

The flat cable high-frequency filter 10 configured as described above may be used in the following mobile electronic device. FIG. 6A is a side sectional view of the arrangement of components defining a mobile electronic device 1 according to the first preferred embodiment. FIG. 6B is a plan sectional view of the arrangement of the components defining the mobile electronic device 1.

The electronic device 1 includes a thin device housing 2. Within the device housing 2, mount circuit boards 3A and 3B (corresponding to "mount circuit members" in a preferred embodiment of the present invention), which are circuit elements, are disposed. A plurality of integrated circuit (IC) chips 5 and mount components 6 are mounted on the surfaces of the mount circuit boards 3A and 3B. The mount circuit boards 3A and 3B are disposed in the device housing 2 such that they are adjacent to each other, as viewing the device housing 2 from above. The mount circuit board 3B is preferably thicker than the mount circuit board 3A. For example, when the internal circuit in the mount circuit board 3B is multifunctional and the internal circuit in the mount circuit board 3A is relatively simple, the thickness of the mount circuit board 3B is thicker than that of the mount circuit board 3A.

Since the device housing 2 is thin as possible, the distance between the mount circuit board 3B and the device housing 2 is very small in the thickness direction of the device housing 2. Accordingly, it is difficult to dispose a coaxial cable to connect the mount circuit boards 3A and 3B.

In contrast, by disposing the flat cable high-frequency filter 10 such that the thickness direction of the flat cable high-frequency filter 10 coincides with that of the device housing 2, the flat cable high-frequency filter 10 is able to be inserted between the mount circuit boards 3A and 3B and the device housing 2.

Additionally, in a case in which it is necessary to insert a high-frequency filter into a transmission path connecting the mount circuit boards 3A and 3B, the flat cable high-frequency filter 10 of the first preferred embodiment may be used. The use of the flat cable high-frequency filter 10 is more space-saving than the use of two separate components, that is, a flat cable, which is a transmission line, and a high-frequency filter. It is also possible to make an electronic device thinner by using the flat cable high-frequency filter 10 than that using a high-frequency filter constituted by mount components of a multilayer body.

The flat cable high-frequency filter 10 of the first preferred embodiment has flexibility so that it can be curved or bent. Accordingly, even if the thicknesses of the mount circuit boards 3A and 3B are different, the flat cable high-frequency filter 10 can be disposed efficiently within the device housing 2, thus saving space in the arrangement of the flat cable high-frequency filter 10.

In this case, the curving or bending position of the flat cable high-frequency filter 10 is a position other than the region in which the capacitor is located, that is, the region in which the capacitive coupling conductor pattern 410 is located. This prevents a fluctuation in the capacitance caused by the curving or the bending of the flat cable high-frequency filter 10, thus implementing desired filter characteristics.

When curving or bending the flat cable high-frequency filter 10, by suitably setting the thickness of the dielectric layers 201 and 202 of the dielectric substrate 20 having flexibility and the thickness of the capacitive coupling conductor pattern 410 having a certain level of stiffness, the curved or bent shape is able to be maintained. More specifically, the thickness of the dielectric layers 201 and 202 may be set to be about 25 μm to about 50 μm, for example, and the thickness of the conductor patterns 401 and 402 and the capacitive coupling conductor pattern 410 may be set to be about half the thickness of the dielectric layers 201 and 202, for example.

With this configuration, as shown in FIGS. 6A and 6B, the flat cable high-frequency filter 10 can be disposed separately from (not in contact with) the mount circuit boards 3A and 3B. It is thus possible to reduce electromagnetic interference between the flat cable high-frequency filter 10 and the mount circuit boards 3A and 3B, thus improving transmission characteristics between the mount circuit boards 3A and 3B and high-frequency filter characteristics. In particular, if the flat cable high-frequency filter 10 is separated from the mount circuit boards 3A and 3B by about 100 μm or greater, the effect of reducing electromagnetic interference is sufficiently exhibited.

Figure 7A:
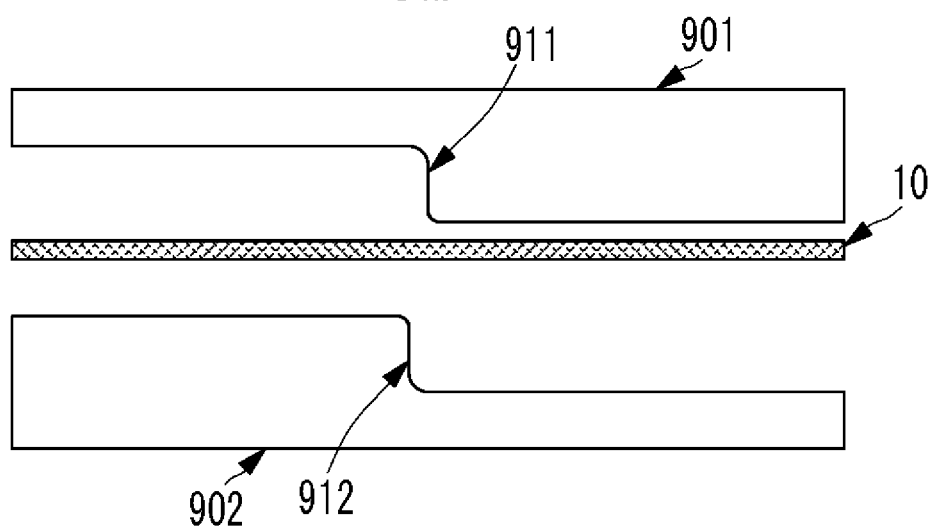
FIGS. 7A and 7B are partial side views illustrating a method for forming a bent portion in a flat cable high-frequency filter.
Figure 7B:
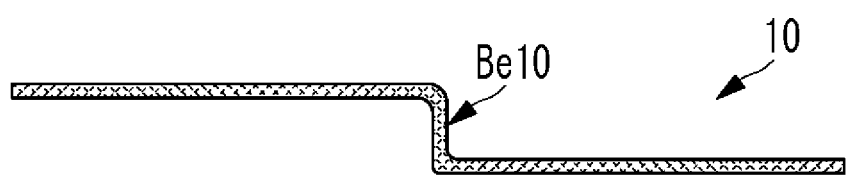

A bent shape of the flat cable high-frequency filter 10 may be formed by using a method shown in FIGS. 7A and 7B. FIGS. 7A and 7B are partial side views illustrating a method for forming a bent portion in the flat cable high-frequency filter 10. FIG. 7A illustrates the flat cable high-frequency filter 10 and tools for forming a bent portion in the flat cable high-frequency filter 10. FIG. 7B illustrates the flat cable high-frequency filter 10 after a bent portion is formed.

As shown in FIG. 7A, the flat cable high-frequency filter 10 is clamped between a first tool 901 including a step 911 in the thickness direction and a second tool 902 including a step 912 in the thickness direction. In this case, the first and second tools 901 and 902 clamp the flat cable high-frequency filter 10 therebetween so that the steps 911 and 912 clamp the flat cable high-frequency filter 10 therebetween while abutting both surfaces of the flat cable high-frequency filter 10. If necessary, heat is applied. Then, the flat cable high-frequency filter 10 can be bent at a certain position in the longitudinal direction.

The edge portions of the steps 911 and 912 are beveled and define a round beveled shape in cross section. With the configuration of the steps 911 and 912, a bent portion Be10 can be formed without damaging the flat cable high-frequency filter 10.

Figure 8:
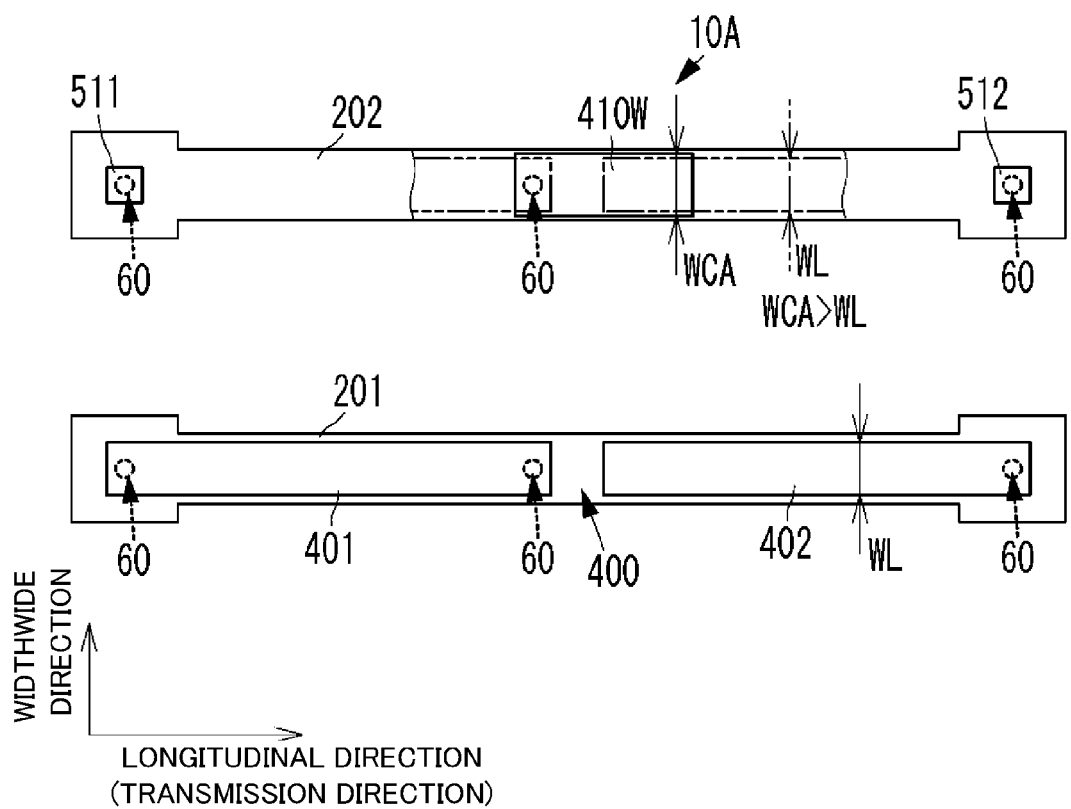
FIG. 8 is an exploded plan view of a flat cable high-frequency filter according to a second preferred embodiment of the present invention.

A flat cable high-frequency filter 10A according to a second preferred embodiment will be described below with reference to the exploded plan view of FIG. 8. The flat cable high-frequency filter 10A is different from the flat cable high-frequency filter 10 of the first preferred embodiment only in the configuration of a capacitive coupling conductor pattern 410W. Accordingly, portions different from the first preferred embodiment will be discussed specifically.

The width WCA of the capacitive coupling conductor pattern 410W of the flat cable high-frequency filter 10A is greater than the width WL of the conductor patterns 401 and 402. With this configuration, as well as the configuration of the first preferred embodiment, an LC series resonance circuit can also be provided, and advantages similar to those of the first preferred embodiment are obtained. The ratio of the width WL of the conductor patterns 401 and 402 to the width WCA of the capacitive coupling conductor pattern 410W is preferably a ratio represented by, for example, $1.0 \geq WL/WCA \geq 0.8$.

With the configuration of the second preferred embodiment, when stacking the dielectric layers 201 and 202, even if the widthwise positions of the dielectric layers 201 and 202 are displaced from each other, the areas by which the capacitive coupling conductor pattern 410W opposes the conductor patterns 401 and 402 do not change if the displacement amount is within a difference between the widths WCA and WL. Accordingly, the flat cable high-frequency filter 10A having a desired capacitance is more easily manufactured. Additionally, a variation in the characteristics among flat cable high-frequency filters as products is significantly reduced or prevented.

Figure 9:
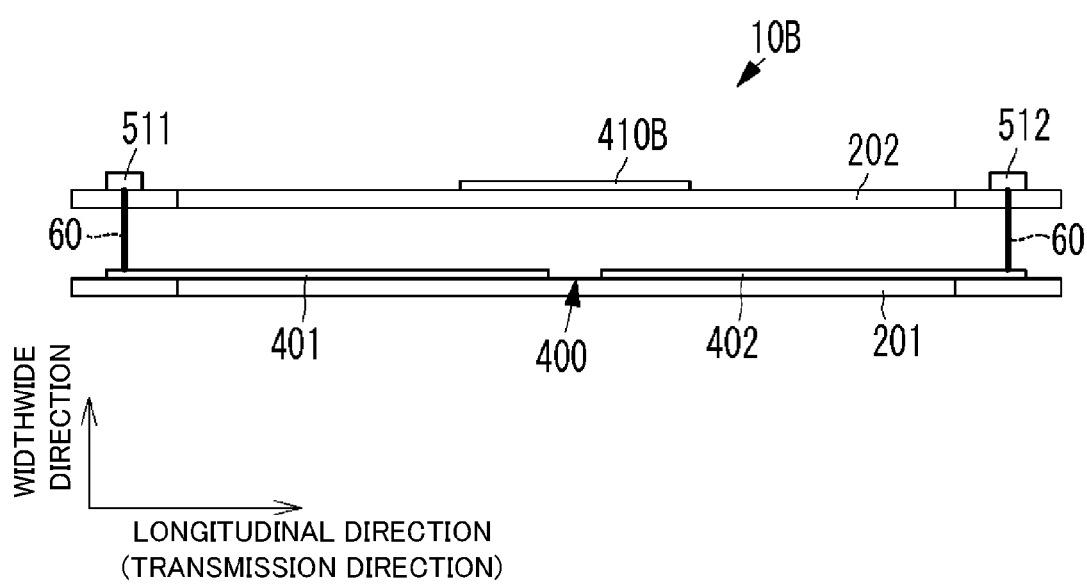
FIG. 9 is an exploded side view of a flat cable high-frequency filter according to a third preferred embodiment of the present invention.

A flat cable high-frequency filter 10B according to a third preferred embodiment will be described below with reference to the exploded side view of FIG. 9. The flat cable high-frequency filter 10B is different from the flat cable high-frequency filter 10 of the first preferred embodiment in the configuration of a capacitive coupling conductor pattern 410B and the relationship between the capacitive coupling conductor pattern 410B and the conductor pattern 401. Accordingly, portions different from the first preferred embodiment will be discussed specifically.

The capacitive coupling conductor pattern 410B opposes the conductor pattern 401 by a predetermined area. The capacitive coupling conductor pattern 410B is not connected to the conductor pattern 401 by a connecting conductor 60. In other words, the capacitive coupling conductor pattern 410B and the conductor pattern 401 merely oppose each other with the dielectric layer 202 therebetween.

With this configuration, it is possible to provide an LC series resonance circuit constituted by an inductor, a capacitor, a capacitor, and an inductor connected in series with each other in this order. By suitably setting the areas by which the capacitive coupling conductor pattern 410B opposes the conductor patterns 401 and 402, a desired capacitance of each capacitor can be obtained. Thus, advantages similar to those of the first preferred embodiment are implemented.

With the configuration of the second preferred embodiment, even if the position at which the dielectric layers 201 and 202 are stacked is longitudinally displaced from each other, the area by which the capacitive coupling conductor pattern 410B opposes the conductor pattern 401 and that by which capacitive coupling conductor pattern 410B opposes the conductor pattern 402 are offset by each other in the following manner. If the area by which the capacitive coupling conductor pattern 410B opposes the conductor pattern 401 increases, the area by which the capacitive coupling conductor pattern 410B opposes the conductor pattern 402 decreases, and if the area by which the capacitive coupling conductor pattern 410B opposes the conductor pattern 401 decreases, the area by which the capacitive coupling conductor pattern 410B opposes the conductor pattern 402 increases. Accordingly, it is possible to significantly reduce or prevent a fluctuation in the capacitance caused by the positional displacement when stacking the dielectric layers 201 and 202. Thus, the flat cable high-frequency filter 10B having a desired capacitance is more reliably manufactured. Additionally, a variation in the characteristics among flat cable high-frequency filters as products is significantly reduced or prevented.

Figure 10:
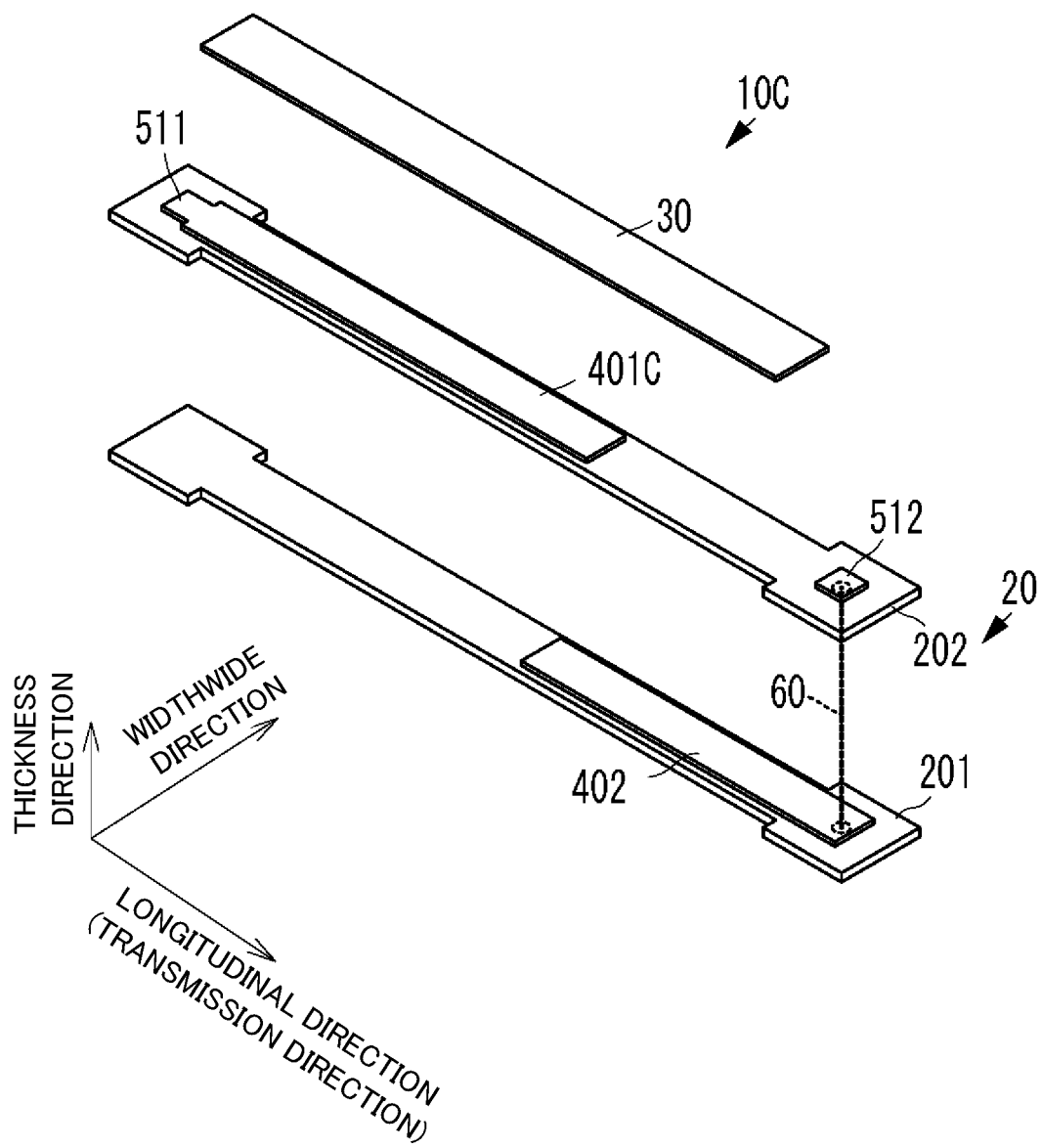
FIG. 10 is an exploded perspective view of a flat cable high-frequency filter according to a fourth preferred embodiment of the present invention.

A flat cable high-frequency filter 10C according to a fourth preferred embodiment will be described below with reference to the exploded perspective view of FIG. 10. The flat cable high-frequency filter 10C is different from the flat cable high-frequency filter 10 of the first preferred embodiment only in the configuration of a conductor pattern 401C. Accordingly, portions different from the first preferred embodiment will be discussed specifically.

The conductor pattern 401C is provided on the surface of the dielectric layer 202 which does not face the dielectric layer 201. One longitudinal end of the conductor pattern 401C is connected to the external connection conductor 511. A predetermined region near the other end of the external connection conductor 511 opposes the conductor pattern 402 by a predetermined area.

With this configuration, advantages similar to those of the first preferred embodiment is obtained. Additionally, in the configuration of the fourth preferred embodiment, since the conductor pattern 401C is connected to the external connection conductor 511 in the same plane, the number of connecting conductors is reduced. This makes it possible to simplify the structure of the flat cable high-frequency filter 10C and also to improve the reliability.

Figure 11:
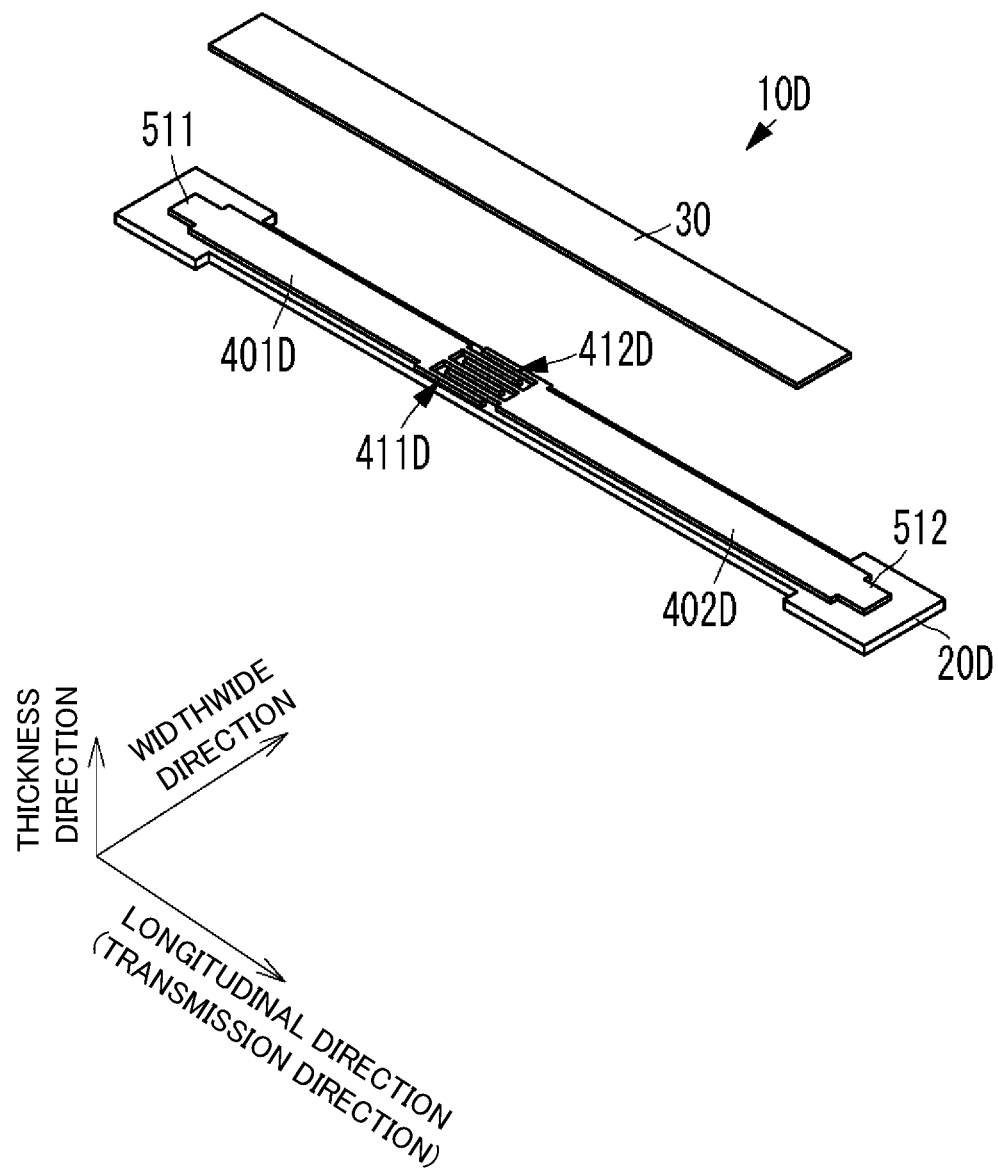
FIG. 11 is an exploded perspective view of a flat cable high-frequency filter according to a fifth preferred embodiment of the present invention.

A flat cable high-frequency filter 10D according to a fifth preferred embodiment will be described below with reference to the exploded perspective view of FIG. 11.

The flat cable high-frequency filter 10D is preferably made of the same material as the flat cable high-frequency filter 10 of the first preferred embodiment, but the configurations of a dielectric substrate 20D and conductor patterns 401D and 402D are different from those of the first preferred embodiment. Accordingly, portions different from the first preferred embodiment will be discussed specifically.

The dielectric substrate 20D preferably is constituted by a single layer. The conductor patterns 401D and 402D are provided on one flat surface of the dielectric substrate 20D. The conductor patterns 401D and 402D are arranged side by side in the longitudinal direction of the dielectric substrate 20D.

An external connection conductor 511 is located at one longitudinal end of the dielectric substrate 20D, while an external connection conductor 512 is located at the other longitudinal end of the dielectric substrate 20D. The conductor pattern 401D is connected to the external connection conductor 511, while the conductor pattern 402D is connected to the external connection conductor 512.

An interdigital capacitive coupling conductor pattern 411D is located near an end portion of the conductor pattern 401D adjacent to the conductor pattern 402D (end portion which does not face the external connection conductor 511). An interdigital capacitive coupling conductor pattern 412D is located near an end portion of the conductor pattern 402D adjacent to the conductor pattern 401D (end portion which does not face the external connection conductor 512).

The capacitive coupling conductor patterns 411D and 412D are disposed such that conductor fingers extending in the longitudinal direction oppose each other in the longitudinal direction by a predetermined length with a predetermined space in the widthwise direction between the conductor fingers of the capacitive coupling conductor patterns 411D and 412D. With this configuration, a capacitor is provided on the flat surface of the single-layer dielectric substrate 20D.

With this configuration, advantages similar to those of the first preferred embodiment are obtained. Additionally, in the configuration of the fifth preferred embodiment, since the single-layer dielectric substrate 20D is used, the structure of the flat cable high-frequency filter 10D is further simplified and the thickness thereof is further reduced. As a result, the reliability is improved.

A flat cable high-frequency filter 10E according to a sixth preferred embodiment will be described below with reference to the exploded perspective view of FIG. 12.

The flat cable high-frequency filter 10E of the sixth preferred embodiment is configured such that shield conductors 711, 712, 721, and 722 are added to the flat cable high-frequency filter 10C of the fourth preferred embodiment. Accordingly, portions different from the fourth preferred embodiment will be discussed specifically.

A dielectric substrate 20E is constituted by dielectric layers 201, 202, 211, and 212 stacked on each other. The dielectric layers 211 and 212 are disposed such that they sandwich the dielectric layers 201 and 202 therebetween. The dielectric layer 211 abuts against the dielectric layer 201, while the dielectric layer 212 abuts against the dielectric layer 202.

A conductor pattern 402E and a capacitive coupling conductor pattern 412E are provided on the flat surface of the dielectric layer 201 which faces the dielectric layer 202. A conductor pattern 401E and a capacitive coupling conductor pattern 411E are provided on the flat surface of the dielectric layer 202 which faces the dielectric layer 212.

The capacitive coupling conductor patterns 411E and 412E oppose each other with the dielectric layer 202 therebetween.

The shield conductors 711 and 712 and external connection conductors 511 and 512 are provided on the flat surface of the dielectric layer 212 which does not face the dielectric layer 202. The external connection conductor 511 is connected to the conductor pattern 401E by a connecting conductor 60. The external connection conductor 512 is connected to the conductor pattern 402E by a connecting conductor 60.

The shield conductors 721 and 722 are provided on the flat surface of the dielectric layer 211 which faces the dielectric layer 201.

The shield conductors 711 and 721 are disposed such that they are superposed on the conductor pattern 401E and are superposed neither on the capacitive coupling conductor pattern 411E nor 412E, as viewed in the thickness direction. The shield conductors 712 and 722 are disposed such that they are superposed on the conductor pattern 402E and are superposed neither on the capacitive coupling conductor pattern 411E nor 412E, as viewed in the thickness direction.

With this configuration, the conductor patterns 401E and 402E are prevented from electromagnetically interfering with an external circuit. It is also possible to significantly reduce or prevent a fluctuation in the capacitance of the capacitors defined by the capacitive coupling conductor patterns 411E and 412E caused by the shield conductors 711, 712, 721, and 722. Therefore, a flat cable high-frequency filter exhibiting high transmission characteristics and filter characteristics is implemented.

The above-described shield conductor may be located at at least one of the above-described four positions. In this case, at least advantages unique to the sixth preferred embodiment are obtained.

Figure 12:
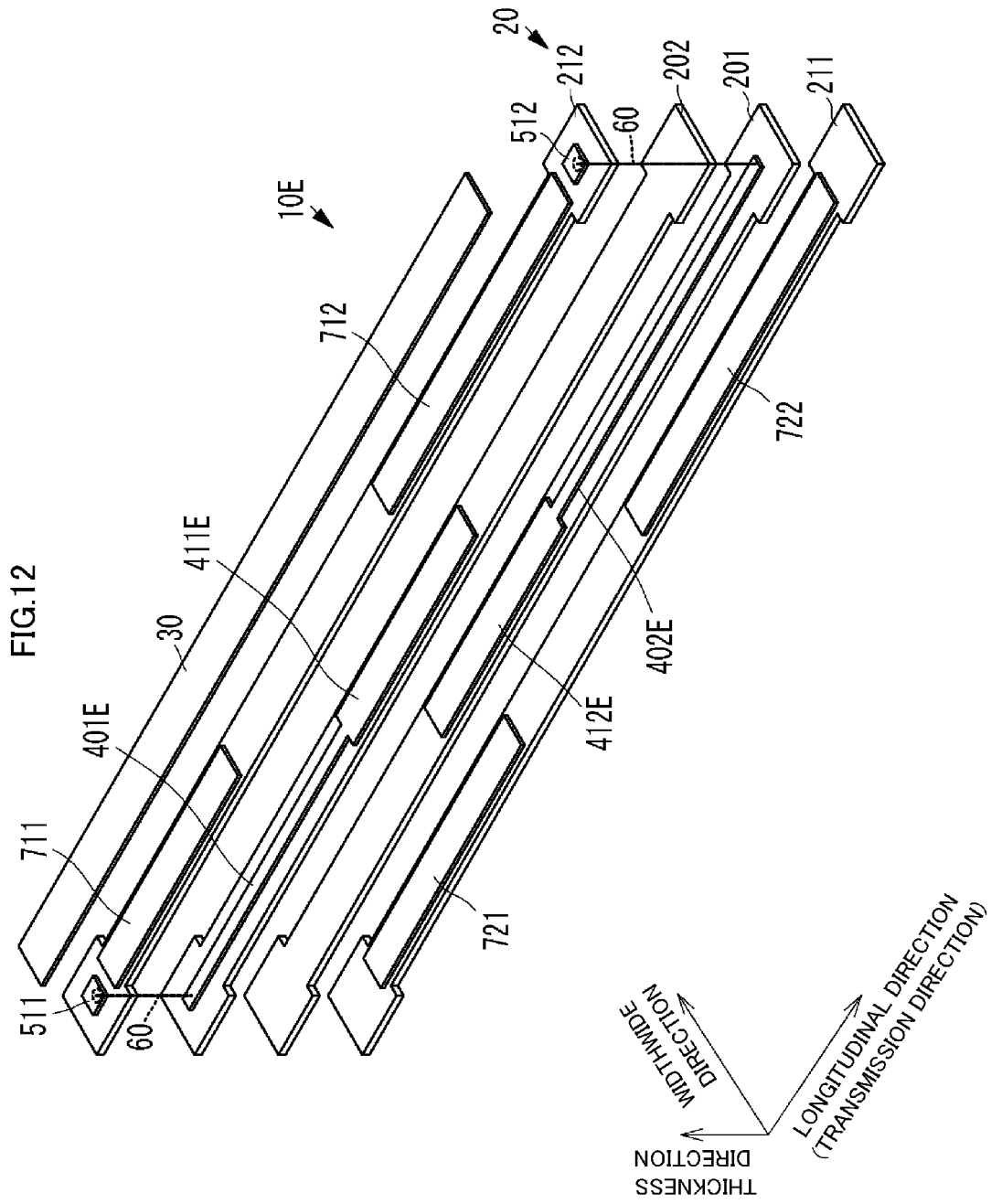
FIG. 12 is an exploded perspective view of a flat cable high-frequency filter according to a sixth preferred embodiment of the present invention.

The shield conductors 711, 712, 721, and 722 may be solid conductors, as shown in FIG. 12, or may be mesh-shaped conductors.

Figure 13:
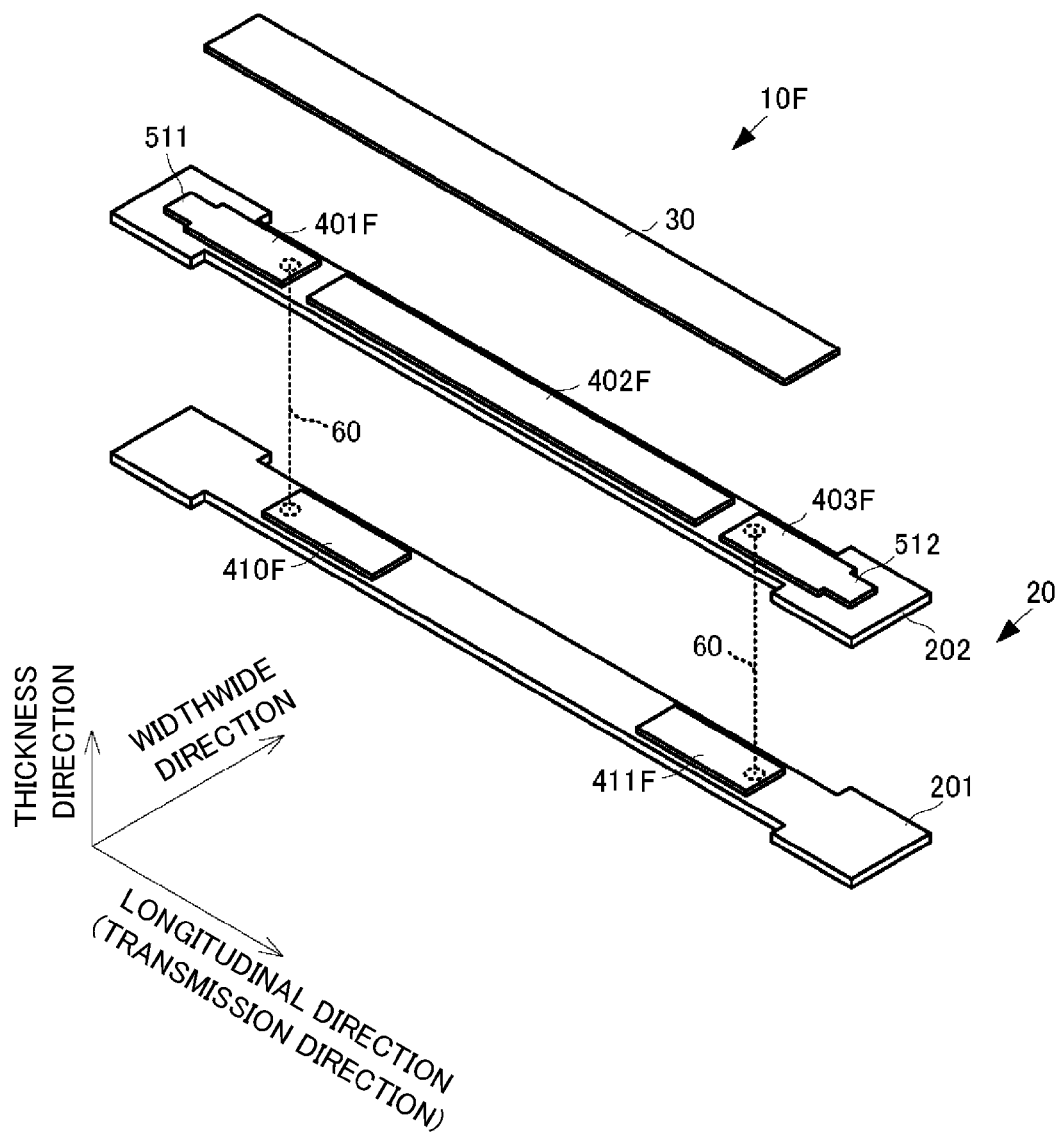
FIG. 13 is an exploded perspective view of a flat cable high-frequency filter according to a seventh preferred embodiment of the present invention.
Figure 14:
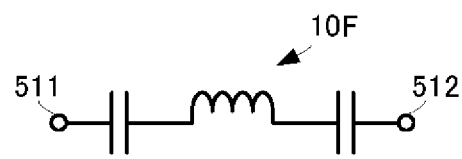
FIG. 14 is an equivalent circuit diagram of the flat cable high-frequency filter according to the seventh preferred embodiment.

A flat cable high-frequency filter 10F according to a seventh preferred embodiment will be described below with reference to FIGS. 13 and 14. FIG. 13 is an exploded perspective view of the flat cable high-frequency filter 10F of the seventh preferred embodiment.

The flat cable high-frequency filter 10F is different from the flat cable high-frequency filter 10 of the first preferred embodiment only in the configuration of conductor patterns. Accordingly, portions different from the first preferred embodiment will be discussed specifically.

Capacitive coupling conductor patterns 410F and 411F are provided on the flat surface of a dielectric layer 201 which faces the dielectric layer 202. Conductor patterns 401F, 402F, and 403F are provided on the flat surface of the dielectric layer 202 which does not face the dielectric layer 201. The conductor patterns 401F, 402F, and 403F are arranged side by side in the longitudinal direction of the dielectric layer 202.

One end of the conductor pattern 401F is connected to an external connection conductor 511, and the other end of the conductor pattern 401F is connected to the capacitive coupling conductor pattern 410F by a connecting conductor 60.

One end of the conductor pattern 403F is connected to an external connection conductor 512, and the other end of the conductor pattern 403F is connected to the capacitive coupling conductor pattern 411F by a connecting conductor 60.

A predetermined region near one end of the conductor pattern 402F opposes the capacitive coupling conductor pattern 410F by a predetermined area. A predetermined region near the other end of the conductor pattern 402F opposes the capacitive coupling conductor pattern 411F by a predetermined area.

With this configuration, the conductor pattern 402F defines and functions as an inductor. Portions at which the capacitive coupling conductor patterns 410F and 411F oppose the conductor pattern 402F with the dielectric layer 202 therebetween define and function as capacitors. FIG. 14 is an equivalent circuit diagram of the flat cable high-frequency filter 10F according to the seventh preferred embodiment. With the above-described configuration, as shown in FIG. 14, an LC series resonance circuit constituted by a capacitor, an inductor, and a capacitor connected in series with each other in this order is provided between the external connection conductors 511 and 512. In this case, as discussed above, by suitably determining the configuration of the conductor pattern 402F and the configurations of the capacitive coupling conductor patterns 410F and 411F, the inductance of the inductor and the capacitance of each capacitor is set to be desired values. It is thus possible to implement a filter in which a desired frequency range is set to be a passband and the frequency ranges outside of the passband are set to be attenuation bands.

The flat cable high-frequency filter 10F has flexibility, so that it is able to be disposed by being curved or bent. In this case, the curving or bending position of the flat cable high-frequency filter 10F is a position other than the region in which the capacitors are located, that is, the region in which the capacitive coupling conductor patterns 410F and 411F are located. This prevents a fluctuation in the capacitance caused by the curving or the bending of the flat cable high-frequency filter 10F, thus implementing desired filter characteristics.

Figure 15:
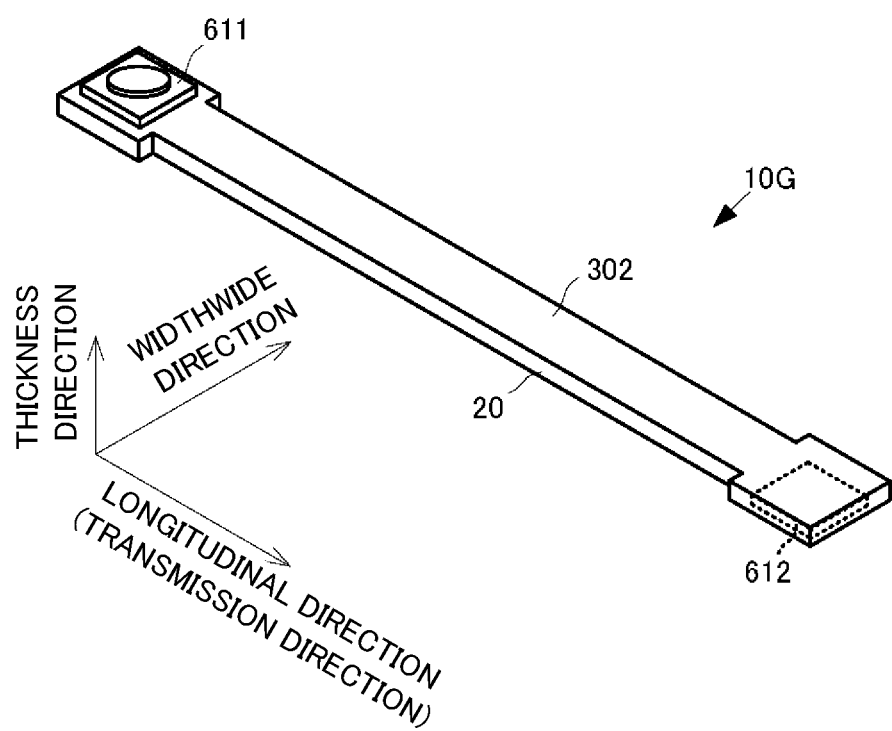
FIG. 15 is an external perspective view of a flat cable high-frequency filter according to an eighth preferred embodiment of the present invention.
Figure 16:
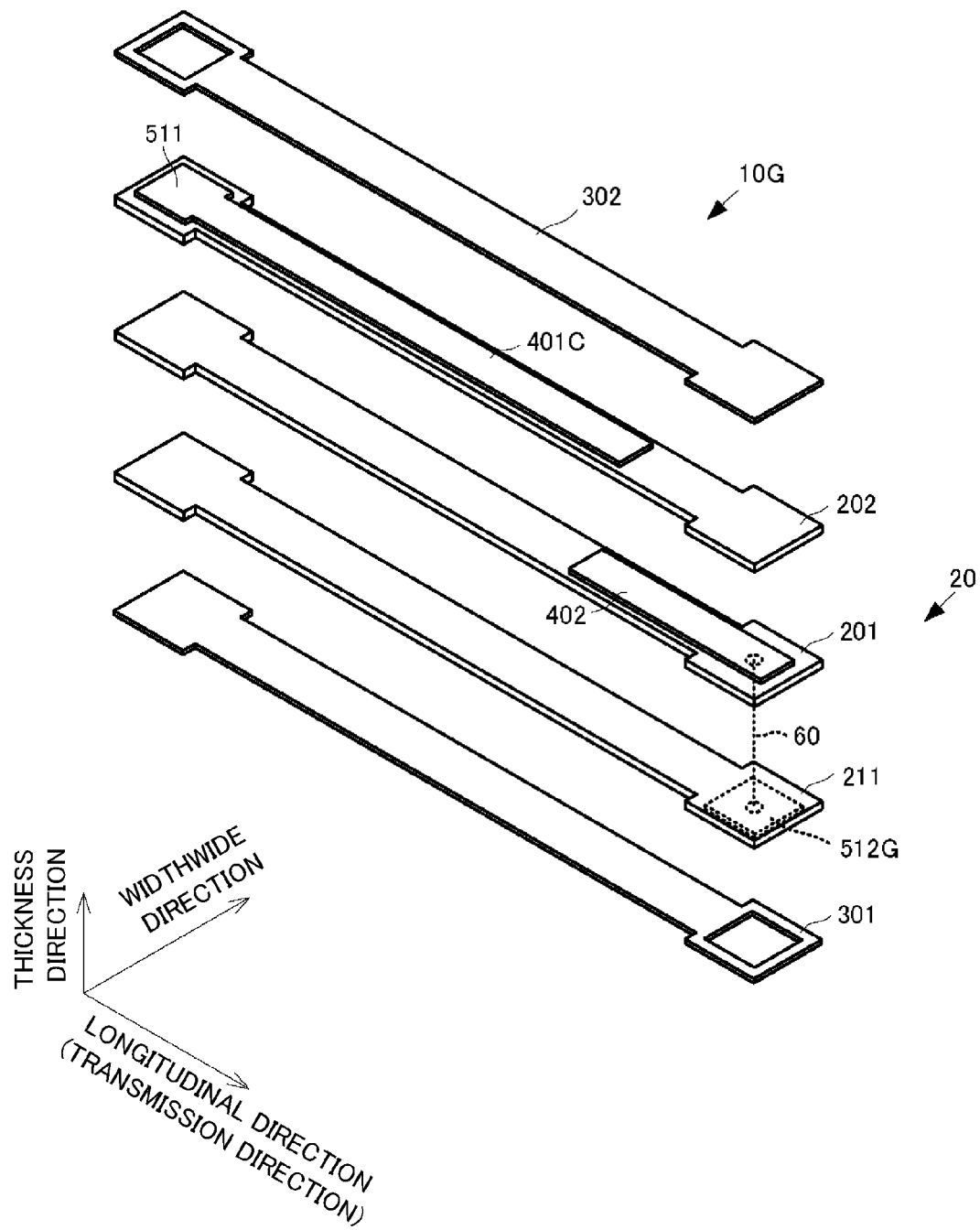
FIG. 16 is an exploded perspective view of the flat cable high-frequency filter according to the eighth preferred embodiment.
Figure 17:
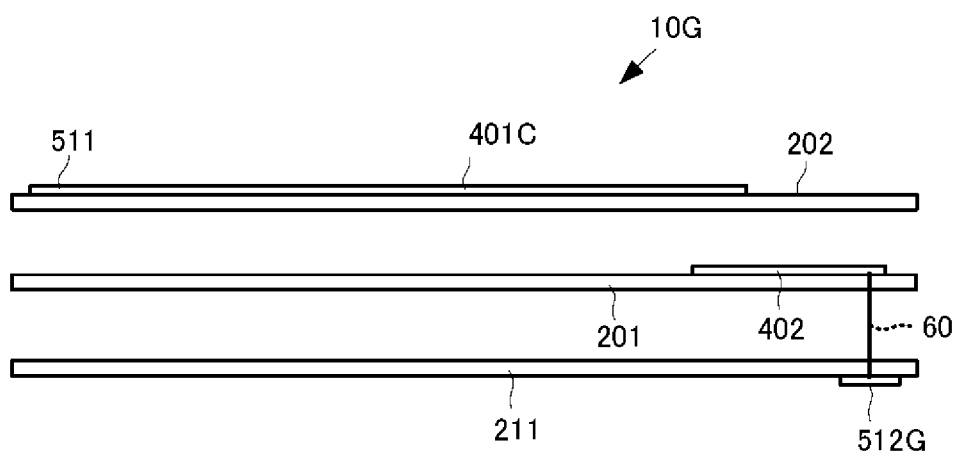
FIG. 17 is an exploded side view of the flat cable high-frequency filter according to the eighth preferred embodiment.

A flat cable high-frequency filter 10G according to an eighth preferred embodiment will be described below with reference to FIGS. 15 through 19. FIG. 15 is an external perspective view of the flat cable high-frequency filter 10G of the eighth preferred embodiment. FIG. 16 is an exploded perspective view of the flat cable high-frequency filter 10G of the eighth preferred embodiment. FIG. 17 is an exploded side view of the flat cable high-frequency filter 10G of the eighth preferred embodiment.

The flat cable high-frequency filter 10G is different from the flat cable high-frequency filter 10C of the fourth preferred embodiment in the position of an external connection conductor 512G. Accordingly, portions different from the fourth preferred embodiment will be discussed specifically.

A dielectric substrate 20 is constituted by dielectric layers 201, 202, and 211 stacked on each other. The dielectric layers 202 and 211 are disposed with the dielectric layer 201 therebetween. The dielectric layer 211 abuts against the dielectric layer 201.

The external connection conductor 512G is provided on the flat surface of the dielectric layer 211 which does not face the dielectric layer 201. The external connection conductor 512G is connected to a conductor pattern 402 by a connecting conductor 60.

Protecting layers 301 and 302 are disposed with the dielectric substrate 20 therebetween. The protecting layer 301 is disposed such that the external connection conductor 512G projects from the protecting layer 301. The protecting layer 302 is disposed such that an external connection conductor 511 projects from the protecting layer 302 and that it covers a conductor pattern 401C.

A connector 611 is provided on one principal surface of the flat cable high-frequency filter 10G and is connected to the external connection conductor 511. A connector 612 is provided on the other principal surface of the flat cable high-frequency filter 10G and is connected to the external connection conductor 512G.

The region by which the conductor pattern 401C opposes the conductor pattern 402, that is, a region in which a capacitor is located, is disposed near the connector 612.

Figure 18A:
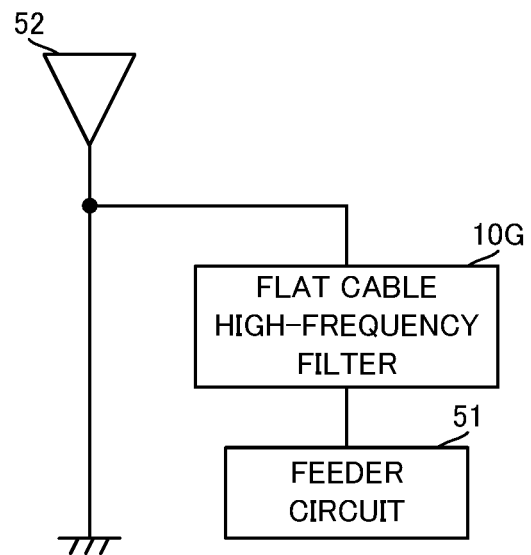
FIGS. 18A and 18B are block diagrams of the configurations of an antenna connecting portion according to the eighth preferred embodiment.
Figure 18B:
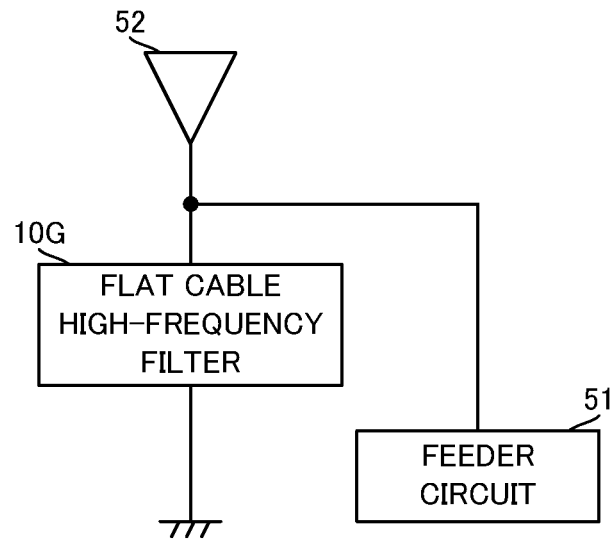
Figure 19:
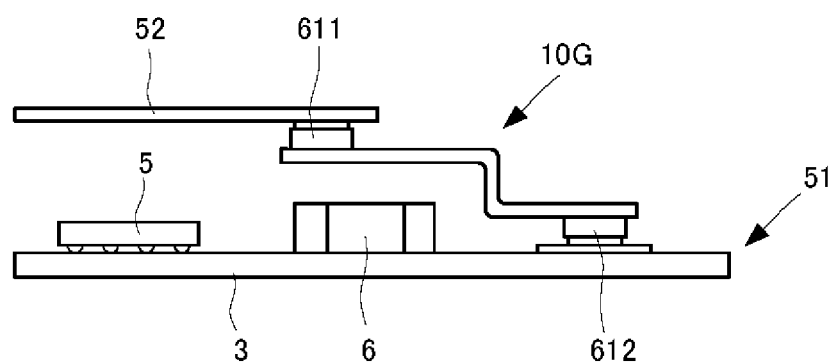
FIG. 19 is a side view of the configuration of the antenna connecting portion according to the eighth preferred embodiment of the present invention.

The flat cable high-frequency filter 10G configured as described above may be used in the following antenna connecting portion. FIGS. 18A and 18B are block diagrams of the configurations of an antenna connecting portion according to the eighth preferred embodiment. FIG. 19 is a side view of the configuration of the antenna connecting portion according to the eighth preferred embodiment.

As shown in FIG. 18A, the flat cable high-frequency filter 10G is connected between an antenna 52 and a feeder circuit 51. The node between the antenna 52 and the flat cable high-frequency filter 10G is connected to a ground.

The antenna connecting portion may be formed in another configuration, such as that shown in FIG. 18B. In FIG. 18B, the flat cable high-frequency filter 10G is connected between the antenna 52 and a ground. The feeder circuit 51 is connected to the node between the antenna 52 and the flat cable high-frequency filter 10G.

As shown in FIG. 19, the feeder circuit 51 includes a mount board 3, IC chips 5, and mount components 6. A plurality of IC chips 5 and a plurality of mount components 6 are mounted on the surface of the mount board 3. The antenna 52 is disposed at a position separated from the mount board 3.

The connector 611 of the flat cable high-frequency filter 10G is connected to the antenna 52, while the connector 612 is connected to the feeder circuit 51. That is, the region in which the capacitor of the flat cable high-frequency filter 10G is located is spaced from the antenna 52.

If the antenna 52 is disposed near the capacitor forming region, the Q factor is decreased. With this configuration, the capacitor forming region is spaced from the antenna 52 by a certain distance, thus suppressing a decrease in the antenna characteristics. The portion of the flat cable high-frequency filter 10G which is closer to the antenna 52 than the capacitor forming region is a linear conductor. Accordingly, this portion is able to be used as a portion of the antenna.

As discussed above, the bending or curving position of the flat cable high-frequency filter 10G is a position other than the capacitor forming region. This prevents a fluctuation in the capacitance caused by the curving or the bending of the flat cable high-frequency filter 10G, thus implementing desired filter characteristics. If this bending or curving position is set as close as to the capacitor forming region, the portion of the flat cable high-frequency filter 10G that is able to also be used as the antenna is increased. If this bending or curving position is changed, the impedance of the antenna is adjusted.

The connector 611 is provided on one principal surface of the flat cable high-frequency filter 10G, while the connector 612 is provided on the opposite principal surface. Accordingly, it is not necessary to bend and turn over the flat cable high-frequency filter 10G only for the purpose of connecting the connectors 611 and 612 to the antenna 52 and the feeder circuit 51, respectively. Thus, even with a very small space between the antenna 52 and the mount board 3, the flat cable high-frequency filter 10G is able to be inserted therebetween.

Even in a case in which the antenna 52 is disposed on an IC chip 5 or a mount component 6, the flat cable high-frequency filter 10G may be bent or curved so as to be inserted between the antenna 52 and the mount board 3.

Figure 20:
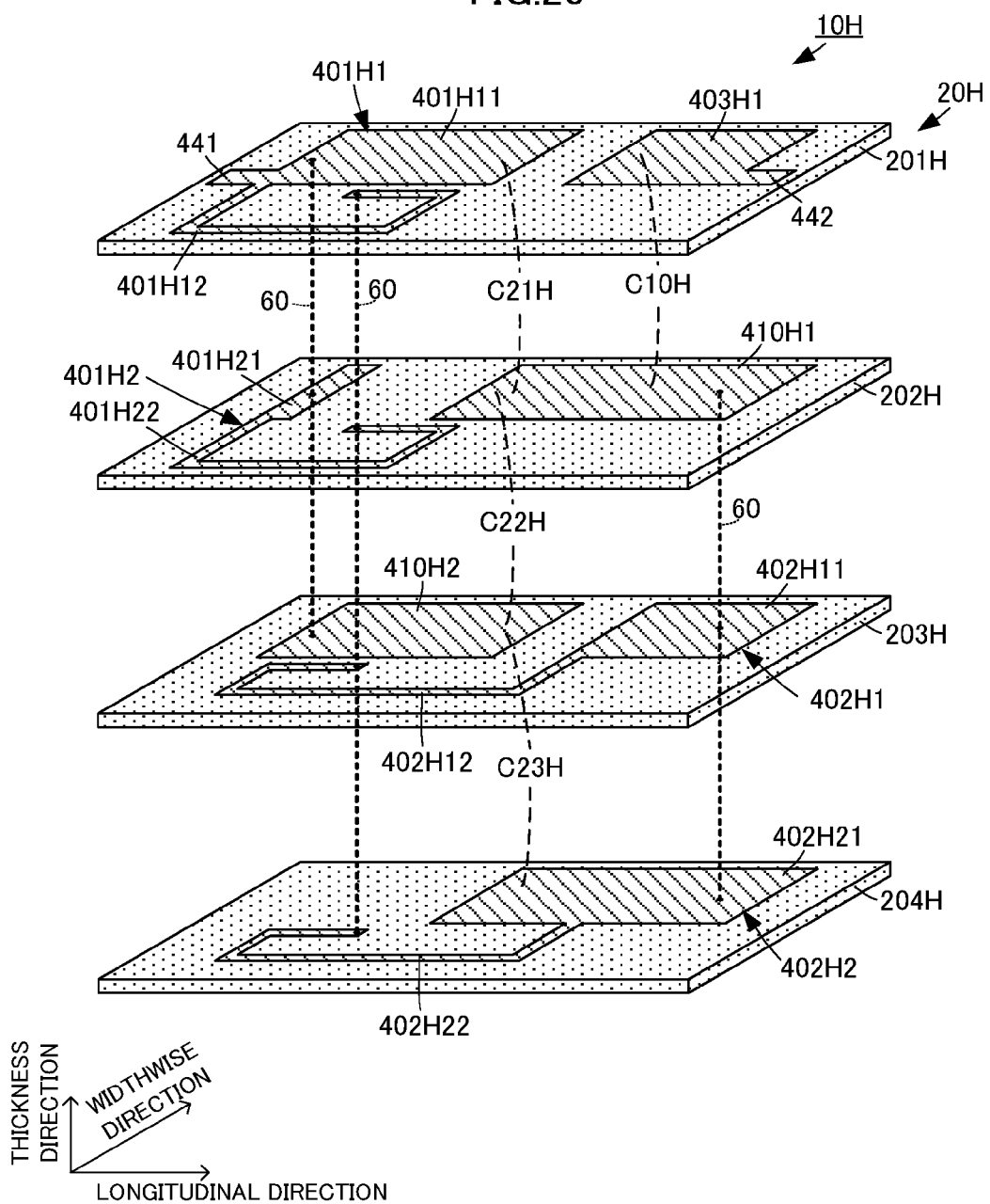
FIG. 20 is an exploded perspective view of a flat cable high-frequency filter according to a ninth preferred embodiment of the present invention.

A flat cable high-frequency filter 10H according to a ninth preferred embodiment will be described below with reference to FIGS. 20 through 22B. FIG. 20 is an exploded perspective view of the flat cable high-frequency filter 10H of the ninth preferred embodiment. In FIG. 20, protecting layers and connectors are not shown.

As in the flat cable high-frequency filter 10 of the first preferred embodiment, in the flat cable high-frequency filter 10H of the ninth preferred embodiment, a connecting portion to be connected to an external circuit is provided on one principal surface of a dielectric substrate 20H. The components of the flat cable high-frequency filter 10H are substantially the same as those of the above-described preferred embodiments. Accordingly, portions unique to the ninth preferred embodiment will be described specifically.

The flat cable high-frequency filter 10H includes a flat dielectric substrate 20H. The dielectric substrate 20H are constituted by dielectric layers 201H, 202H, 203H, and 204H sequentially stacked on each other.

Conductor patterns 401H1 and 403H1 are provided on a principal surface of the dielectric layer 201H which does not face the dielectric layer 202H (on one principal surface of the dielectric substrate 20H). The conductor pattern 401H1 includes a first partial conductor pattern 401H11 and a second partial conductor pattern 401H12.

The first partial conductor pattern 401H11 and the conductor pattern 403H1 are disposed along the longitudinal direction of the dielectric layer 201H with a space therebetween. The first partial conductor pattern 401H11 and the conductor pattern 403H1 have the same or substantially the same width, which is wider than the second partial conductor pattern 401H12. In terms of the functions of the first partial conductor pattern 401H11 and the conductor pattern 403H1, they each have a width sufficient to define a capacitor, which will be discussed below.

The second partial conductor pattern 401H12 is disposed adjacent to the first partial conductor pattern 401H11 along the widthwise direction of the dielectric layer 201H. The second partial conductor pattern 401H12 is a loop shaped conductor pattern. The loop shaped conductor pattern is a pattern formed in a loop shape, a portion of which is removed.

An end of one side portion of the first partial conductor pattern 401H11 (one end of the dielectric layer 201H) and one end (outer peripheral end) of the second partial conductor pattern 401H12 are connected to each other near one end of the dielectric layer 201H. The first and second partial conductor patterns 401H11 and 401H12 are connected to an extended conductor pattern 441 located at one end of the dielectric layer 201H.

An end of one side portion of the conductor pattern 403H1 (the other end of the dielectric layer 201H) is connected to an extended conductor pattern 442 located at the other end of the dielectric layer 201H.

On the principal surface of the dielectric layer 202H which faces the dielectric layer 201H, a conductor pattern 401H2 and a capacitive coupling conductor pattern 410H1 are provided. The conductor pattern 401H2 includes a first partial conductor pattern 401H21 and a second partial conductor pattern 401H22.

The first partial conductor pattern 401H21 preferably is rectangular or substantially rectangular and opposes a portion of the first partial conductor pattern 401H11 with the dielectric layer 201H therebetween. The first partial conductor pattern 401H21 is connected to the first partial conductor pattern 401H11 by a connecting conductor 60 passing through the dielectric layer 201H in the thickness direction.

The second partial conductor pattern 401H22 is disposed adjacent to the first partial conductor pattern 401H21 along the widthwise direction of the dielectric layer 202H. The second partial conductor pattern 401H22 is a loop shaped conductor pattern. The second partial conductor pattern 401H22 is superposed on the second partial conductor pattern 401H12, as viewed in the direction perpendicular to the principal surface. One end (outer peripheral end) of the second partial conductor pattern 401H22 is connected to the first partial conductor pattern 401H21. The other end (inner peripheral end) of the second partial conductor pattern 401H22 is connected to the other end (inner peripheral end) of the second partial conductor pattern 401H12 by a connecting conductor 60 passing through the dielectric layer 201H in the thickness direction.

The capacitive coupling conductor pattern 410H1 preferably is rectangular or substantially rectangular and opposes both of the first partial conductor pattern 401H11 and the conductor pattern 403H1 with the dielectric layer 201H therebetween. The portion by which the capacitive coupling conductor pattern 410H1 opposes the first partial conductor pattern 401H11 that defines or functions as a capacitor C21H. The portion by which capacitive coupling conductor pattern 410H1 opposes the conductor pattern 403H1 defines and functions as a capacitor C10H.

On the principal surface of the dielectric layer 203H which faces the dielectric layer 202H, a capacitive coupling conductor pattern 410H2 and a conductor pattern 402H1 are provided. The conductor pattern 402H1 includes a first partial conductor pattern 402H11 and a second partial conductor pattern 402H12.

The capacitive coupling conductor pattern 410H2 and the first partial conductor pattern 402H11 are disposed along the longitudinal direction of the dielectric layer 203H with a space therebetween. The capacitive coupling conductor pattern 410H2 and the first partial conductor pattern 402H11 have the same or substantially the same width. The capacitive coupling conductor pattern 410H2 is connected to the first portion conductor patter 401H21 by a connecting conductor 60 passing through the dielectric layer 202H in the thickness direction.

The first partial conductor pattern 402H11 preferably is rectangular or substantially rectangular and opposes part of the capacitive coupling conductor pattern 410H1 with the dielectric layer 202H therebetween. The first partial conductor pattern 402H11 is connected to the capacitive coupling conductor pattern 410H1 by a connecting conductor 60 passing through the dielectric layer 202H in the thickness direction.

The second partial conductor pattern 402H12 is disposed adjacent to the capacitive coupling conductor pattern 410H2 along the widthwise direction of the dielectric layer 203H. The second partial conductor pattern 402H12 is a loop shaped conductor pattern. One end (outer peripheral end) of the second partial conductor pattern 402H12 is connected to the first partial conductor pattern 402H11. The other end (inner peripheral end) of the second partial conductor pattern 402H12 is superposed on the other ends (inner peripheral ends) of the second partial conductor patterns 401H22 and 401H12, as viewed in the direction perpendicular to the principal surface. The other end (inner peripheral end) of the second partial conductor pattern 402H12 is connected to the other end (inner peripheral end) of the second partial conductor pattern 401H22 by a connecting conductor 60 passing through the dielectric layer 202H.

The capacitive coupling conductor pattern 410H2 preferably is rectangular or substantially rectangular and opposes both of the first partial conductor pattern 401H21 and the capacitive coupling conductor pattern 410H1 with the dielectric layer 202H therebetween. The capacitive coupling conductor pattern 410H2 is connected to the first partial conductor pattern 401H21 by a connecting conductor 60 passing through the dielectric layer 202H in the thickness direction. The portion by which the capacitive coupling conductor patterns 410H1 and 410H2 oppose each other defines and functions as a capacitor C22H.

On the principal surface of the dielectric layer 204H which faces the dielectric layer 203H, a conductor pattern 402H2 is provided. The conductor pattern 402H2 includes a first partial conductor pattern 402H21 and a second partial conductor pattern 402H22.

The first partial conductor pattern 402H21 preferably is rectangular or substantially rectangular and opposes a portion of the capacitive coupling conductor pattern 410H2 and the first partial conductor pattern 402H11 with the dielectric layer 203H therebetween. The first partial conductor pattern 402H21 is connected to the first partial conductor pattern 402H11 by a connecting conductor 60 passing through the dielectric layer 203H in the thickness direction. The portion by which the first partial conductor pattern 402H21 opposes the capacitive coupling conductor pattern 410H2 defines and functions as a capacitor C23H.

The second partial conductor pattern 402H22 is a loop shaped conductor pattern. The second partial conductor pattern 402H22 is superposed on the second partial conductor pattern 402H12, as viewed in the direction perpendicular to the principal surface. One end (outer peripheral end) of the second partial conductor pattern 402H22 is connected to the first partial conductor pattern 402H21. The other end (inner peripheral end) of the second partial conductor pattern 402H22 is connected to the other end (inner peripheral end) of the second partial conductor pattern 402H12 by a connecting conductor 60 passing through the dielectric layer 203H in the thickness direction.

The second partial conductor patterns 401H12, 401H22, 402H12, and 402H22 are disposed as described above, and the inner peripheral ends thereof are connected to each other by the connecting conductor 60, thus defining a spiral inductor L10H having an axis in the thickness direction of the dielectric substrate 20H.

Figure 21:
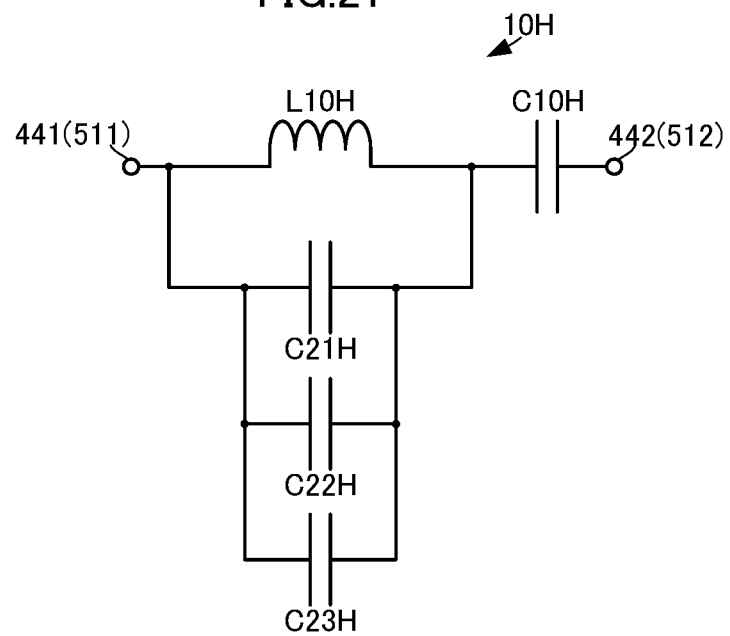
FIG. 21 is an equivalent circuit diagram of the flat cable high-frequency filter according to the ninth preferred embodiment of the present invention.

With this configuration, the flat cable high-frequency filter 10H of the ninth preferred embodiment defines a circuit shown in the equivalent circuit diagram of FIG. 21.

A series circuit of the inductor L10H and a capacitor C10H is connected between the extended conductor patterns 441 and 442. The capacitors C21H, C22H, and C23H are connected in parallel with the inductor L10H. That is, it is possible to provide a filter circuit including both of an LC series resonance circuit and an LC parallel resonance circuit.

Figure 22A:
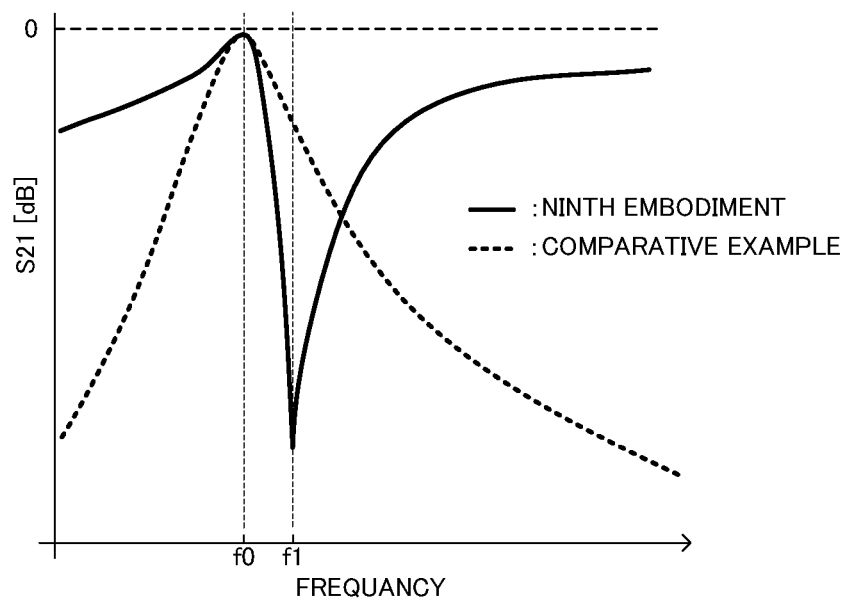
FIGS. 22A and 22B are graphs illustrating transmission characteristics of the flat cable high-frequency filter according to the ninth preferred embodiment of the present invention.
Figure 22B:
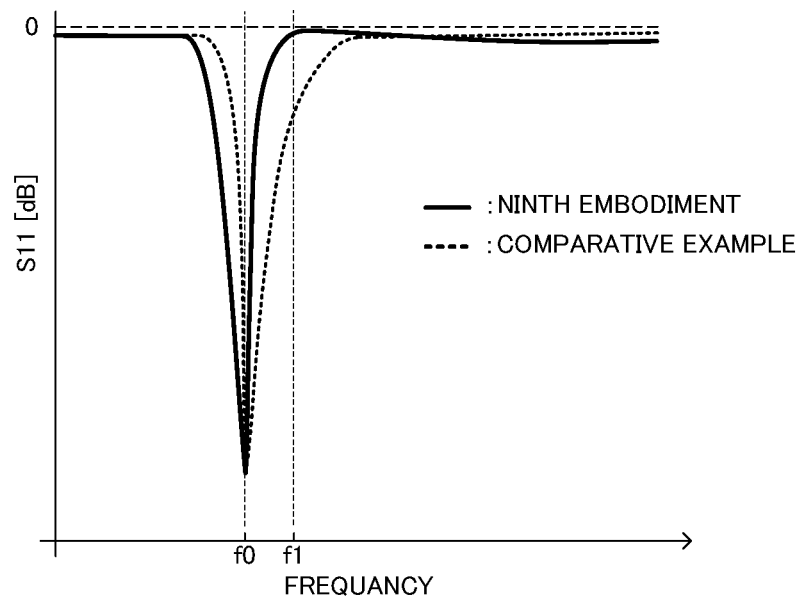

With this circuit configuration, it is possible to obtain transmission characteristics shown in FIGS. 22A and 22B. FIGS. 22A and 22B are graphs illustrating transmission characteristics of the flat cable high-frequency filter 10H according to the ninth preferred embodiment. FIG. 22A illustrates band pass characteristics, while FIG. 22B illustrates reflection characteristics. In the ninth preferred embodiment, the device values of the inductor L10H and the capacitors C10H, C21H, C22H, and C23H are determined so as to obtain characteristics in which a high-frequency signal at frequency f0 passes through the flat cable high-frequency filter 10H and a high-frequency signal at frequency f1 is attenuated. That is, the configurations of the dielectric substrate 20H and the conductor patterns are determined so as to implement these device values.

With the configuration of the ninth preferred embodiment, a high-frequency signal at frequency f0, which is a passband frequency, is able to be transmitted at a small loss, as shown in FIG. 22A, and a high-frequency signal at frequency f1, which is an attenuation frequency, is attenuated significantly, as shown in FIG. 22B.

In this case, as shown in FIGS. 22A and 22B, even if the frequency f0, which is a passband frequency, and the f1, which is the attenuation frequency, are close to each other, it is possible to transmit a high-frequency signal at frequency f0 at a small loss and to significantly attenuate a high-frequency signal at frequency f1. More specifically, the frequency f0 is a global positioning system (GPS) signal frequency, which is about 1.575 GHz, while the frequency f1 is a communication band signal, which is 1.7 GHz band signal. In this manner, even if the frequency difference is about 200 MHz, it is possible to transmit a high-frequency signal at frequency f0 (1.575 GHz) at a small loss and to significantly attenuate a high-frequency signal at frequency f1 (1.7 GHz band).

As described above, with the configuration of the ninth preferred embodiment, it is possible to provide a filter which exhibits a sharp attenuation at a high frequency side of a passband.

In the configuration of the ninth preferred embodiment, portions of conductor patterns defining the inductor L10H are disposed on a plurality of layers. This makes it possible to reduce the ESR of the inductor L10H and also to implement sharp, small loss transmission and attenuation characteristics.

Figure 23:
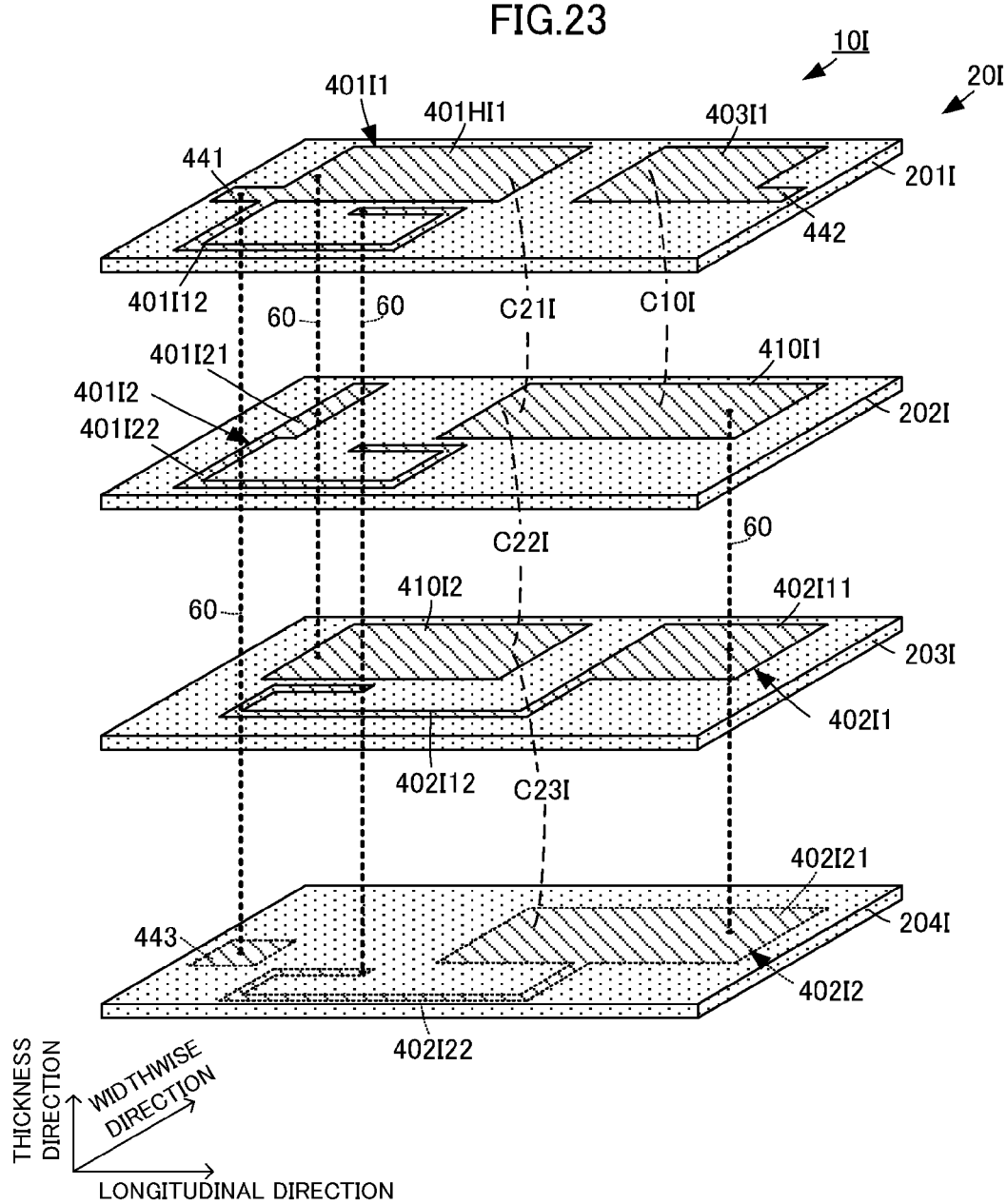
FIG. 23 is an exploded perspective view of a flat cable high-frequency filter according to a tenth preferred embodiment of the present invention.

A flat cable high-frequency filter 10I according to a tenth preferred embodiment will be described below with reference to the exploded perspective view of FIG. 23. In FIG. 23, as well as in FIG. 20, protecting layers and connectors are not shown.

The flat cable high-frequency filter 10I is different from the flat cable high-frequency filter 10H of the ninth preferred embodiment in the configurations of some conductor patterns. The configurations of the other components are basically the same as those of the ninth preferred embodiment.

The flat cable high-frequency filter 10I includes a dielectric substrate 20I constituted by dielectric layers 201I, 202I, 203I, and 204I stacked on each other. The configurations of the conductor patterns on the dielectric layers 201I, 202I, and 203I are the same as those of the dielectric layers 201H, 202H, and 203H of the ninth preferred embodiment.

On the principal surface of the dielectric layer 204I which does not face the dielectric layer 203I, a conductor pattern 402I2 and an extended conductor 443 are provided. The conductor pattern 402I2 is plane-symmetrical to the conductor pattern 402H2 of the ninth preferred embodiment with respect to the principal surface of the dielectric layer used as a reference plane. The extended conductor 443 is configured such that it is superposed on the extended conductor 441, as viewed in the direction perpendicular to the principal surface of the dielectric substrate 20I. The extended conductor 443 is connected to the extended conductor 441 by a connecting conductor 60 passing through the dielectric layers 201I, 202I, 203I, and 204I, that is, the dielectric substrate 20I. The extended conductor 443 is connected to an external connection conductor and a connector, and the extended conductor 441 is not exposed to the outside.

With this configuration, advantages similar to those of the ninth preferred embodiment are obtained. Additionally, as in the eighth preferred embodiment, one external connection portion of the flat cable high-frequency filter 10I is disposed on one principal surface of the dielectric substrate 20I, and the other external connection portion is disposed on the other principal surface of the dielectric substrate 20I. With this configuration, even if external circuit boards to be connected to the flat cable high-frequency filter 10I are disposed with the flat cable high-frequency filter 10I therebetween in the thickness direction, the external circuit boards are easily connected via the flat cable high-frequency filter 10I.

Figure 24:
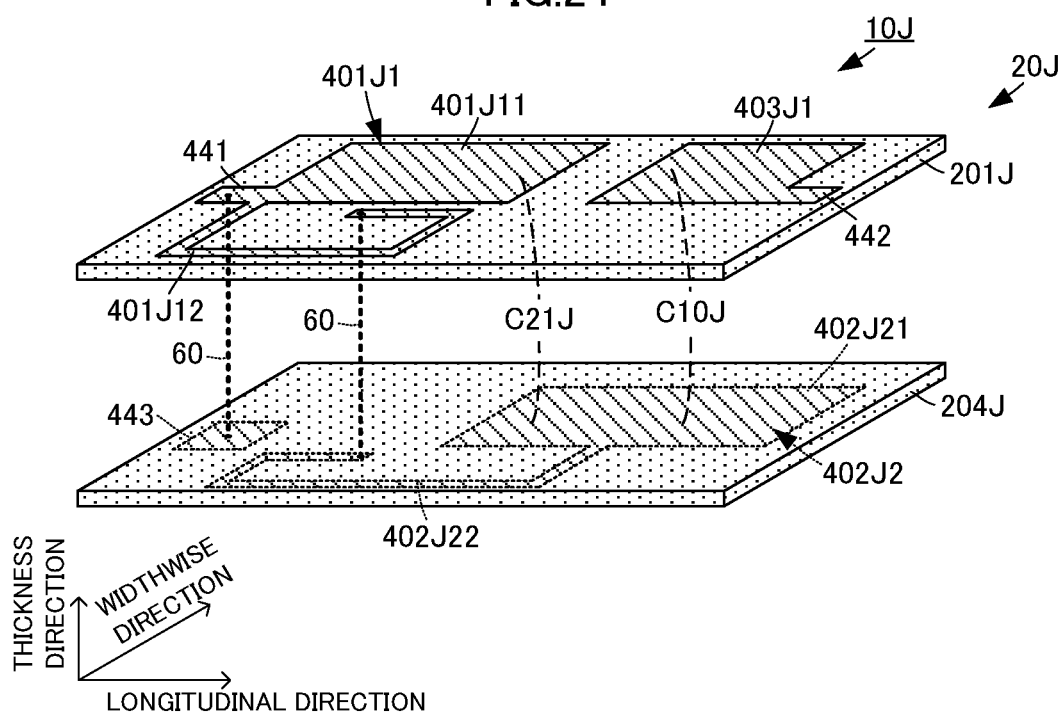
FIG. 24 is an exploded perspective view of a flat cable high-frequency filter according to an eleventh preferred embodiment of the present invention.

A flat cable high-frequency filter 10J according to an eleventh preferred embodiment will be described below with reference to the exploded perspective view of FIG. 24. In FIG. 24, as well as in FIGS. 20 and 23, protecting layers and connectors are not shown.

The flat cable high-frequency filter 10J is a filter from which two dielectric layers are removed from the flat cable high-frequency filter 10I of the tenth preferred embodiment. The configurations of the other elements are basically the same as those of the tenth preferred embodiment.

The flat cable high-frequency filter 10J includes a dielectric substrate 20J constituted by dielectric layers 201J and 204J stacked on each other. The configurations of the conductor patterns disposed on the dielectric layers 201J and 204J are the same as those on the dielectric layers 201I and 204I of the tenth preferred embodiment. A first partial conductor pattern 402J21 also defines and functions as a capacitive coupling conductor pattern.

With this configuration, advantages similar to those of the tenth preferred embodiment are obtained. In the flat cable high-frequency filter 10J of the eleventh preferred embodiment, however, only one capacitor is connected in parallel with the inductor. Thus, if desired transmission characteristics are obtained by the flat cable high-frequency filter 10J, the configuration of the eleventh preferred embodiment may be used. With the configuration of the eleventh preferred embodiment, the number of dielectric layers is reduced, thus making it possible to make the flat cable high-frequency filter 10J even thinner.

Figure 25:
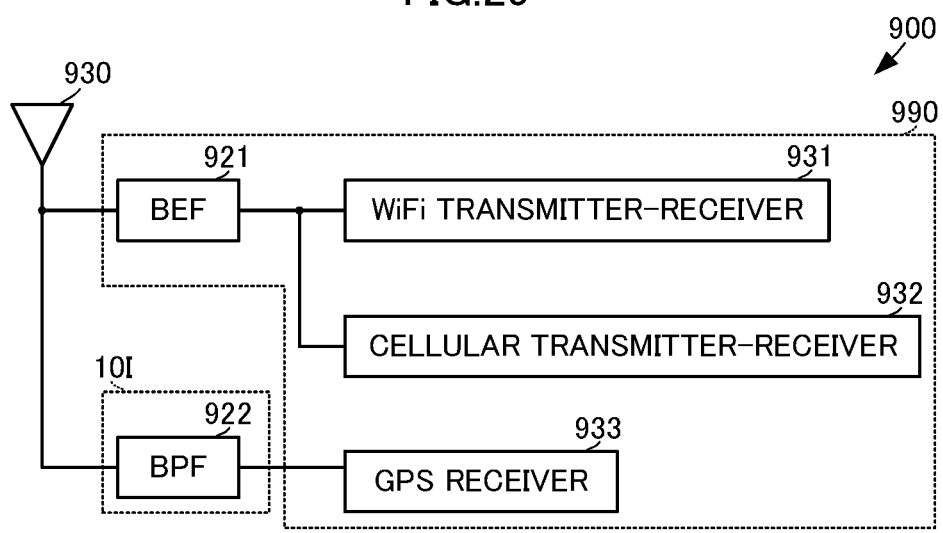
FIG. 25 is a block diagram of a communication device module according to a preferred embodiment of the present invention.
Figure 26:
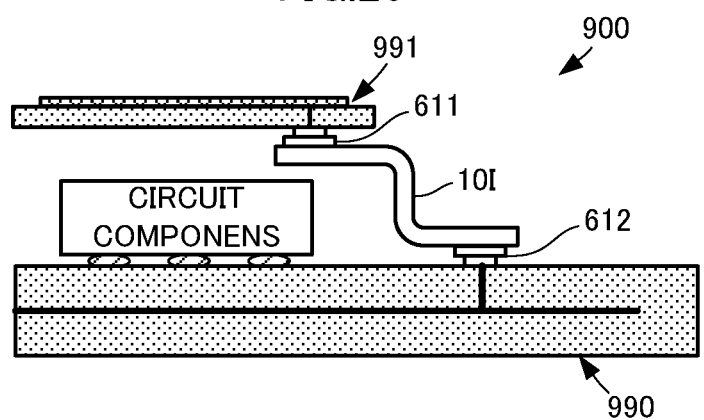
FIG. 26 is a side view of the schematic configuration of a communication device module according to a preferred embodiment of the present invention.

The flat cable high-frequency filters of the above-described preferred embodiments implementing band pass filters may be used in the following communication device module. FIG. 25 is a block diagram of a communication device module 900 according to a preferred embodiment of the present invention. FIG. 26 is a side view of the schematic configuration of the communication device module 900 according to a preferred embodiment of the present invention. In the communication device module 900 shown in FIGS. 25 and 26, the flat cable high-frequency filter 10I of the tenth preferred embodiment is used.

As shown in FIG. 25, the communication device module 900 preferably includes an antenna 930, a WiFi transmitter-receiver 931, a cellular transmitter-receiver 932, a GPS receiver 933, a band elimination filter (BEF) 921, and a band pass filter (BPF) 922.

The antenna 930 is connected to the WiFi transmitter-receiver 931 and the cellular transmitter-receiver 932 via the BEF 921, and is connected to the GPS receiver 933 via the BPF 922.

The WiFi transmitter-receiver 931 transmits and receives WiFi communication signals using a frequency band, for example, a 2.4 GHz band. The cellular transmitter-receiver 932 transmits and receives cellular communication signals using frequency bands, for example, 900 MHz, 1.7 GHz, and 2.0 GHz. The GPS receiver 933 receives GPS signals using a frequency band near 1.5 GHz.

The BEF 921 attenuates the frequency band of GPS signals, and allows the frequency bands of WiFi communication signals and cellular communication signals to pass through the BEF 921. The BPF 922 allows the frequency band of GPS signals to pass through the BPF 922, and attenuates the frequency bands other than the frequency band of GPS signals.

The flat cable high-frequency filter 10I of the tenth preferred embodiment is preferably used as the BPF 922. By the use of the flat cable high-frequency filter 10I, it is possible to implement a BEF having sharp attenuation characteristics with a narrow attenuation band. Accordingly, if an attenuation pole is set in a frequency band of a GPS signal, it is possible to attenuate a GPS signal and to transmit another communication signal in a frequency band (for example, a cellular communication signal in a 1.7 GHz band) near the frequency band of the GPS signal without attenuating the communication signal.

As shown in FIG. 26, the communication device module 900 having the above-described circuit configuration includes a front end substrate 990, an antenna substrate 991, and the flat cable high-frequency filter 10I. On the mount surface of the front end substrate 990, circuit components implementing, for example, the above-described WiFi transmitter-receiver 931, the cellular transmitter-receiver 932, and the GPS receiver 933, are mounted. On the antenna substrate 991, the antenna 930 is provided. The antenna substrate 991 is disposed such that it faces the mount surface of the front end substrate 990 separately from the front end substrate 990.

As shown in FIG. 26, the connector 611 attached to the flat cable high-frequency filter 10I is connected to the surface of the antenna substrate 991 which faces the front end substrate 990. The connector 612 attached to the flat cable high-frequency filter 10I is connected to the surface (mount surface) of the front end substrate 990 which faces the antenna substrate 991. Since the flat cable high-frequency filter 10I has flexibility, a curved or bent portion can be located somewhere between the two ends of the flat cable high-frequency filter 10I in the longitudinal direction. By providing a curved or bent portion, the flat cable high-frequency filter 10I is able to connect the front end substrate 990 and the antenna substrate 991 without being in contact with the circuit components.

As described above, since a BPF is included in the flat cable high-frequency filter 10I, it is not necessary to provide a BPF in the front end substrate 990 or the antenna substrate 991. Accordingly, the front end substrate 990 and the antenna substrate 991 are reduced in size. By the provision of a BPF in the flat cable high-frequency filter 10I, high filter characteristics (band pass characteristics and attenuation characteristics) of the BPF are obtained, thus improving the communication characteristics of the communication device module 900.

Figure 27:
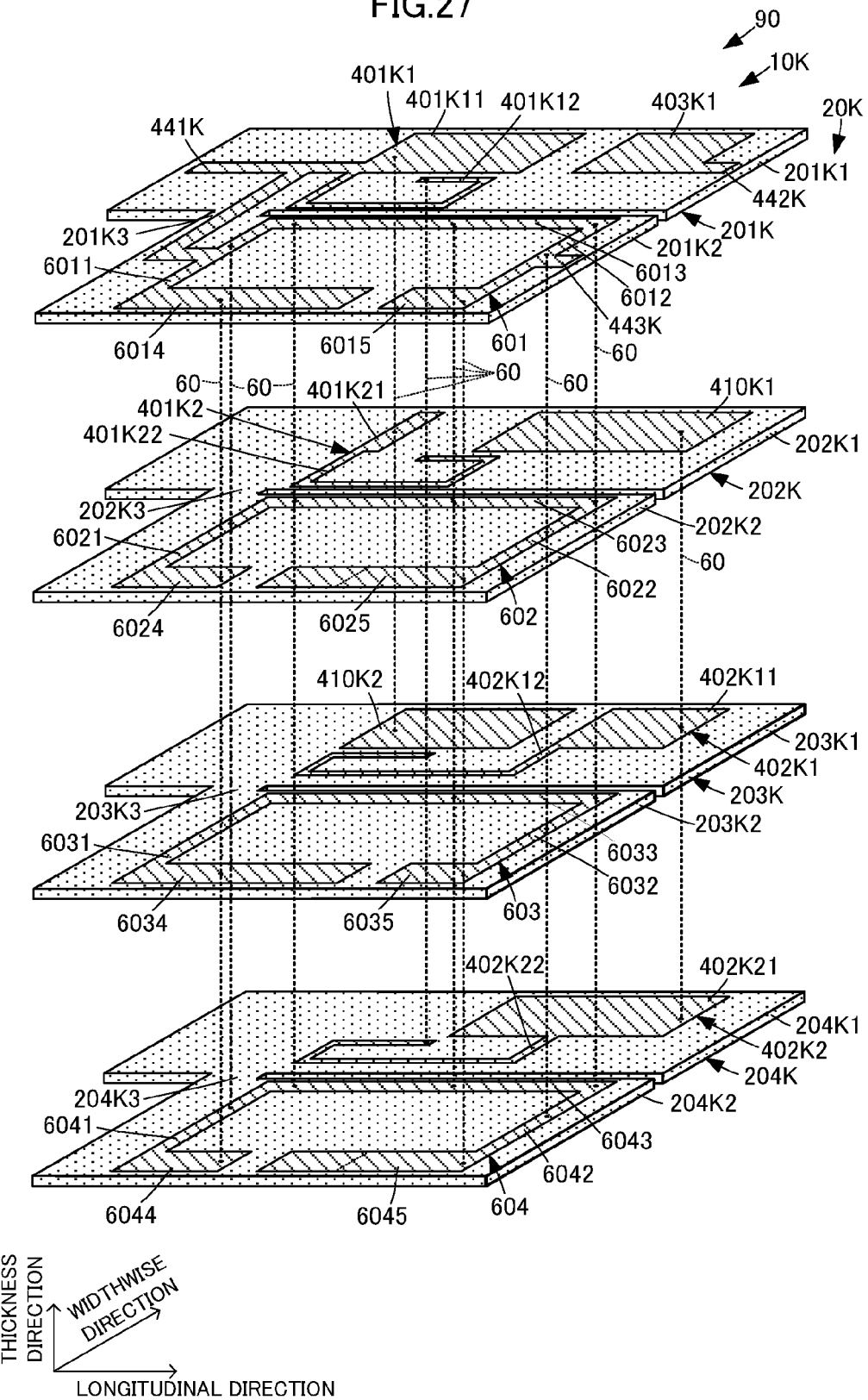
FIG. 27 is an exploded perspective view of a flat cable high-frequency diplexer according to a twelfth preferred embodiment of the present invention.

A flat cable high-frequency diplexer 90 according to a twelfth preferred embodiment will be described below with reference to the exploded perspective view of FIG. 27. In FIG. 27, protecting layers and connectors are not shown.

The flat cable high-frequency diplexer 90 includes a dielectric substrate 20K constituted by dielectric layers 201K, 202K, 203K, and 204K stacked on each other.

The dielectric substrate 201K includes partial regions 201K1, 201K2, and 201K3. The partial regions 201K1 and 201K2 have an elongated shape extending along the longitudinal direction and are disposed with a space therebetween in the widthwise direction. The partial region 201K3 is disposed at one longitudinal end of each of the partial regions 201K1 and 201K2, and connects the partial regions 201K1 and 201K2. With this configuration, at a certain point between the two longitudinal ends of the dielectric layer 201K, the dielectric layer 201K is split into two regions in the widthwise direction.

The dielectric substrate 202K includes partial regions 202K1, 202K2, and 202K3. The partial regions 202K1 and 202K2 have an elongated shape extending along the longitudinal direction and are disposed with a space therebetween in the widthwise direction. The partial region 202K3 is disposed at one longitudinal end of each of the partial regions 202K1 and 202K2, and connects the partial regions 202K1 and 202K2. With this configuration, at a certain point between the two longitudinal ends of the dielectric layer 202K, the dielectric layer 202K is split into two regions in the widthwise direction.

The dielectric substrate 203K includes partial regions 203K1, 203K2, and 203K3. The partial regions 203K1 and 203K2 have an elongated shape extending along the longitudinal direction and are disposed with a space therebetween in the widthwise direction. The partial region 203K3 is disposed at one longitudinal end of each of the partial regions 203K1 and 203K2, and connects the partial regions 203K1 and 203K2. With this configuration, at a certain point between the two longitudinal ends of the dielectric layer 203K, the dielectric layer 203K is split into two regions in the widthwise direction.

The dielectric substrate 204K includes partial regions 204K1, 204K2, and 204K3. The partial regions 204K1 and 204K2 have an elongated shape extending along the longitudinal direction and are disposed with a space therebetween in the widthwise direction. The partial region 204K3 is disposed at one longitudinal end of each of the partial regions 204K1 and 204K2, and connects the partial regions 204K1 and 204K2. With this configuration, at a certain point between the two longitudinal ends of the dielectric layer 204K, the dielectric layer 204K is split into two regions in the widthwise direction.

In a first substrate portion constituted by the partial regions 201K1, 202K1, 203K1, and 204K1 of the dielectric substrate 20K, the same conductor pattern as that of the ninth preferred embodiment is formed. Accordingly, in this first substrate portion, a BPF connected between extended conductors 441K and 442K is formed.

In the partial region 201K2 of the dielectric layer 201K, a loop shaped conductor pattern 601 is provided. The loop shaped conductor pattern 601 includes linear first through fifth conductor patterns 6011 through 6015.

The first conductor pattern 6011 extends in the widthwise direction of the partial region 201K2, and is located near the longitudinal end portion of the partial region 201K2 which is adjacent to the partial region 201K3. The first conductor pattern 6011 is connected to the extended conductor 441K. The second conductor pattern 6012 extends in the widthwise direction of the partial region 201K2, and is located near the longitudinal end portion of the partial region 201K2 which is spaced away from the partial region 201K3. The second conductor pattern 6012 is connected to an extended conductor 443K which is located near the longitudinal end portion of the partial region 201K2 which is spaced away from the partial region 201K3. The extended conductor 443K, as well as the extended conductor 442K, is connected to, for example, a connector, which is not shown.

The third conductor pattern 6013 extends in the longitudinal direction of the partial region 201K2, and is located near the widthwise end portion of the partial region 201K2 which is adjacent to the partial region 201K1. The third conductor pattern 6013 is connected to the first and second conductor patterns 6011 and 6012.

The fourth and fifth conductor patterns 6014 and 6015 extend in the longitudinal direction of the partial region 201K2, and are formed near the widthwise end portion of the partial region 201K2 which is spaced away from the partial region 201K1. The fourth and fifth conductor patterns 6014 and 6015 are disposed along the longitudinal direction of the partial region 201K2 with a space therebetween. The fourth conductor pattern 6014 is connected to the first conductor pattern 6011, and the fifth conductor pattern 6015 is connected to the second conductor pattern 6012.

In the partial region 202K2 of the dielectric layer 202K, a loop shaped conductor pattern 602 is formed. The loop shaped conductor pattern 602 includes linear first through fifth conductor patterns 6021 through 6025.

The first conductor pattern 6021 extends in the widthwise direction of the partial region 202K2, and is located near the longitudinal end portion of the partial region 202K2 which is adjacent to the partial region 202K3. The first conductor pattern 6021 is superposed on the first conductor pattern 6011, as viewed in the direction perpendicular to the principal surface of the dielectric substrate 20K. The second conductor pattern 6022 extends in the widthwise direction of the partial region 202K2, and is located near the longitudinal end portion of the partial region 202K2 which is spaced away from the partial region 202K3. The second conductor pattern 6022 is superposed on the second conductor pattern 6012, as viewed in the direction perpendicular to the principal surface of the dielectric substrate 20K. The third conductor pattern 6023 extends in the longitudinal direction of the partial region 202K2, and is located near the widthwise end portion of the partial region 202K2 which is adjacent to the partial region 202K1. The third conductor pattern 6023 is connected to the first and second conductor patterns 6021 and 6022. The third conductor pattern 6023 is superposed on the third conductor pattern 6013, as viewed in the direction perpendicular to the principal surface of the dielectric substrate 20K.

The fourth and fifth conductor patterns 6024 and 6025 extend in the longitudinal direction of the partial region 202K2, and are located near the widthwise end portion of the partial region 202K2 which is spaced away from the partial region 202K1. The fourth and fifth conductor patterns 6024 and 6025 are disposed along the longitudinal direction of the partial region 202K2 with a space therebetween. The fourth conductor pattern 6024 is connected to the first conductor pattern 6021, and the fifth conductor pattern 6025 is connected to the second conductor pattern 6022. The fourth conductor pattern 6024 is superposed on the fourth conductor pattern 6014, as viewed in the direction perpendicular to the principal surface of the dielectric substrate 20K. The fifth conductor pattern 6025 is superposed on the fourth and fifth conductor patterns 6014 and 6015, as viewed in the direction perpendicular to the principal surface of the dielectric substrate 20K.

In the partial region 203K2 of the dielectric layer 203K, a loop shaped conductor pattern 603 is formed. The loop shaped conductor pattern 603 includes linear first through fifth conductor patterns 6031 through 6035.

The first conductor pattern 6031 extends in the widthwise direction of the partial region 203K2, and is located near the longitudinal end portion of the partial region 203K2 which is adjacent to the partial region 203K3. The first conductor pattern 6031 is superposed on the first conductor patterns 6011 and 6021, as viewed in the direction perpendicular to the principal surface of the dielectric substrate 20K. The second conductor pattern 6032 extends in the widthwise direction of the partial region 203K2, and is located near the longitudinal end portion of the partial region 203K2 which is spaced away from the partial region 203K3. The second conductor pattern 6032 is superposed on the second conductor patterns 6012 and 6022, as viewed in the direction perpendicular to the principal surface of the dielectric substrate 20K. The third conductor pattern 6033 extends in the longitudinal direction of the partial region 203K2, and is located near the widthwise end portion of the partial region 203K2 which is adjacent to the partial region 203K1. The third conductor pattern 6033 is connected to the first and second conductor patterns 6031 and 6032. The third conductor pattern 6033 is superposed on the third conductor patterns 6013 and 6023, as viewed in the direction perpendicular to the principal surface of the dielectric substrate 20K.

The fourth and fifth conductor patterns 6034 and 6035 extend in the longitudinal direction of the partial region 203K2, and are formed near the widthwise end portion of the partial region 203K2 which is spaced away from the partial region 203K1. The fourth and fifth conductor patterns 6034 and 6035 are disposed along the longitudinal direction of the partial region 203K2 with a space therebetween. The fourth conductor pattern 6034 is connected to the first conductor pattern 6031, and the fifth conductor pattern 6035 is connected to the second conductor pattern 6032. The fourth conductor pattern 6034 is superposed on the fourth and fifth conductor patterns 6024 and 6025, as viewed in the direction perpendicular to the principal surface of the dielectric substrate 20K. The fifth conductor pattern 6035 is superposed on the fifth conductor pattern 6025, as viewed in the direction perpendicular to the principal surface of the dielectric substrate 20K.

In the partial region 204K2 of the dielectric layer 204K, a loop shaped conductor pattern 604 is provided. The loop shaped conductor pattern 604 includes linear first through fifth conductor patterns 6041 through 6045.

The first conductor pattern 6041 extends in the widthwise direction of the partial region 204K2, and is located near the longitudinal end portion of the partial region 204K2 which is adjacent to the partial region 204K3. The first conductor pattern 6041 is superposed on the first conductor patterns 6011, 6021, and 6031, as viewed in the direction perpendicular to the principal surface of the dielectric substrate 20K. The second conductor pattern 6042 extends in the widthwise direction of the partial region 204K2, and is located near the longitudinal end portion of the partial region 204K2 which is spaced away from the partial region 204K3. The second conductor pattern 6042 is superposed on the second conductor patterns 6012, 6022, and 6032, as viewed in the direction perpendicular to the principal surface of the dielectric substrate 20K. The third conductor pattern 6043 extends in the longitudinal direction of the partial region 204K2, and is located near the widthwise end portion of the partial region 204K2 which is adjacent to the partial region 204K1. The third conductor pattern 6043 is connected to the first and second conductor patterns 6041 and 6042. The third conductor pattern 6043 is superposed on the third conductor patterns 6013, 6023, and 6033, as viewed in the direction perpendicular to the principal surface of the dielectric substrate 20K.

The fourth and fifth conductor patterns 6044 and 6045 extend in the longitudinal direction of the partial region 204K2, and are located near the widthwise end portion of the partial region 204K2 which is spaced away from the partial region 204K1. The fourth and fifth conductor patterns 6044 and 6045 are disposed along the longitudinal direction of the partial region 204K2 with a space therebetween. The fourth conductor pattern 6044 is connected to the first conductor pattern 6041, and the fifth conductor pattern 6045 is connected to the second conductor pattern 6042. The fourth conductor pattern 6044 is superposed on the fourth conductor pattern 6034, as viewed in the direction perpendicular to the principal surface of the dielectric substrate 20K. The fifth conductor pattern 6045 is superposed on the fourth and fifth conductor patterns 6034 and 6035, as viewed in the direction perpendicular to the principal surface of the dielectric substrate 20K.

The first conductor patterns 6011, 6021, 6031, and 6041 of the dielectric layers 201K, 202K, 203K, and 204K, respectively, are connected to each other by a connecting conductor 60 extending in the thickness direction of the dielectric substrate 20K. The second conductor patterns 6012, 6022, 6032, and 6042 of the dielectric layers 201K, 202K, 203K, and 204K, respectively, are connected to each other by a connecting conductor 60 extending in the thickness direction of the dielectric substrate 20K. The third conductor patterns 6013, 6023, 6033, and 6043 of the dielectric layers 201K, 202K, 203K, and 204K, respectively, are connected to each other by a connecting conductor 60 extending in the thickness direction of the dielectric substrate 20K. The fourth conductor patterns 6014, 6024, 6034, and 6044 of the dielectric layers 201K, 202K, 203K, and 204K, respectively, are connected to each other by a connecting conductor 60 extending in the thickness direction of the dielectric substrate 20K. The fifth conductor patterns 6015, 6025, 6035, and 6045 of the dielectric layers 201K, 202K, 203K, and 204K, respectively, are connected to each other by a connecting conductor 60 extending in the thickness direction of the dielectric substrate 20K.

With this configuration, the principal inductor is defined by the third conductor patterns 6013, 6023, 6033, and 6043. A region from the nodes between the first conductor patterns 6011, 6021, 6031, and 6041 and the extended conductor 441K to the end portions of the first conductor patterns 6011, 6021, 6031, and 6041 connecting to the third conductor patterns 6013, 6023, 6033, and 6043, respectively, and a region from the nodes between the second conductor patterns 6012, 6022, 6032, and 6042 and the extended conductor 443K to the end portions of the second conductor patterns 6012, 6022, 6032, and 6042 connecting to the third conductor patterns 6013, 6023, 6033, and 6043, respectively, also define and function as inductors which continue from the principal inductor constituted by the third conductor patterns 6013, 6023, 6033, and 6043.

A portion by which the fourth conductor pattern 6014 and the fifth conductor pattern 6025 oppose each other, a portion by which the fifth conductor pattern 6025 and the fourth conductor pattern 6034 oppose each other, and a portion by which the fourth conductor pattern 6034 and the fifth conductor pattern 6045 oppose each other define and function as capacitors.

With this configuration, a second substrate portion constituted by the partial regions 201K2, 202K2, 203K2, and 204K2 of the dielectric substrate 20K defines a LC parallel resonance BEF including an inductor and a capacitor connected in parallel with each other. That is, a BEF connected between the extended conductors 441K and 443K is provided in the portion constituted by the partial regions 201K2, 202K2, 203K2, and 204K2. In the above-described BPF, flat cable itself is a BPF. In a similar manner, in the BEF, the flat cable itself is a BEF, thus exhibiting high band elimination characteristics (attenuation characteristics).

Then, by adjusting the elimination band (attenuation band) of the BEF to the passband of the BPF, a high-frequency diplexer constituted by the dielectric substrate 20K on which the individual conductor patterns are disposed is provided. It is thus possible to implement a thin high-frequency diplexer exhibiting high transmission characteristics.

The flat cable high-frequency diplexer 90 of the twelfth preferred embodiment may be used in a portion constituted by the BEF 921, the BPF 922, and transmission lines to connect the BEF 921 and the BPF 922 to the antenna 930, such as those shown in the circuit diagram of FIG. 25.

The flat cable high-frequency diplexer 90 of the twelfth preferred embodiment may also be used to connect the antenna substrate 991 and the front end substrate 990 in a mounting mode, such as that shown in FIG. 26.

A variable capacitance element may be attached to the above-described flat cable high-frequency filters and the flat cable high-frequency diplexer, so that it may be connected in series with the inductor and the capacitor forming the above-described high-frequency filter. In this case, for example, a land conductor may be located at a position near an external connection conductor, and a mount variable capacitance element may be mounted on this land conductor.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high-frequency filter connected between a first circuit element including an antenna and a second circuit element, the high-frequency filter comprising:
   a dielectric substrate that includes a flat film;
   a plurality of conductor patterns that are not connected to each other and include a gap provided between opposing end portions of the plurality of conductor patterns; and
   a capacitive coupling conductor pattern that is superposed on the plurality of conductor patterns in a thickness direction of the dielectric substrate through the dielectric substrate and is configured to capacitively couple the plurality of conductor patterns, wherein
   the plurality of conductor patterns define inductors;
   the capacitive coupling conductor pattern defines a capacitor; and
   a region of the dielectric substrate in which the capacitive coupling conductor pattern is located is provided at a position closer to the second circuit element than to the first circuit element in the dielectric substrate.

2. The high-frequency filter according to claim 1, further comprising a linear conductor provided in the dielectric substrate between the first circuit element and the region in which the capacitive coupling conductor pattern is located.

3. The high-frequency filter according to claim 1, wherein, in the dielectric substrate, a bent portion is located at a position other than the region in which the capacitive coupling conductor pattern is located.

4. The high-frequency filter according to claim 1, wherein
   the first circuit element and the second circuit element are located at different positions in a height direction from each other;
   the first circuit element is connected to a first surface of the dielectric substrate; and
   the second circuit element is connected to a second surface of the dielectric substrate.

5. The high-frequency filter according to claim 1, wherein the first circuit element and the second circuit element are connected through a connector provided on a surface of the dielectric substrate.

6. The high-frequency filter according to claim 1, wherein the second circuit element includes a substrate on which at least one of an integrated circuit (IC) chip and a mount component is mounted.

7. The high-frequency filter according to claim 1, wherein the dielectric substrate has a dielectric loss tangent equal to or smaller than about 0.005.

8. The high-frequency filter according to claim 7, wherein the dielectric substrate is made of a liquid crystal polymer.

9. The high-frequency filter according to claim 1, wherein the capacitive coupling conductor pattern includes:
   a flat conductor pattern which opposes a certain one of the plurality of conductor patterns with a dielectric layer of the dielectric substrate therebetween; and
   a flat region of the certain one of the plurality of conductor patterns which opposes the flat conductor pattern.

10. The high-frequency filter according to claim 9, wherein a width of a conductor pattern which opposes the capacitive coupling conductor pattern is the same or substantially the same as a width of a conductor pattern which does not oppose the capacitive coupling conductor pattern.

11. The high-frequency filter according to claim 10, wherein the width of the conductor patterns which opposes the capacitive coupling conductor pattern and the width of a conductor pattern which does not oppose the capacitive coupling conductor pattern are the same or substantially the same as a width of the dielectric substrate.

12. An electronic device comprising:
   the high-frequency filter according to claim 1; and
   a plurality of mount circuit members; wherein the plurality of mount circuit members are connected to each other by the high-frequency filter.

13. The electronic device according to claim 12, wherein the high-frequency filter is disposed with a predetermined gap from each of the plurality of mount circuit members.

14. An electronic device comprising:
   a first circuit element including an antenna;
   a second circuit element; and
   a high-frequency filter connected between the first circuit element and the second circuit element, the high-frequency filter comprising:
      a dielectric substrate that includes a flat film;
      a plurality of conductor patterns that are not connected to each other and include a gap provided between opposing end portions of the plurality of conductor patterns; and
      a capacitive coupling conductor pattern that is superposed on the plurality of conductor patterns in a thickness direction of the dielectric substrate through the dielectric substrate and is configured to capacitively couple the plurality of conductor patterns, wherein:
   the plurality of conductor patterns define inductors;
   the capacitive coupling conductor pattern defines a capacitor; and
   a region of the dielectric substrate in which the capacitive coupling conductor pattern is located is provided at a position closer to the second circuit element than to the first circuit element in the dielectric substrate.

15. The electronic device according to claim 14, further comprising a linear conductor provided in the dielectric substrate between the first circuit element and the region in which the capacitive coupling conductor pattern is located.

16. The electronic device according to claim 14, wherein, in the dielectric substrate, a bent portion is located at a position other than the region in which the capacitive coupling conductor pattern is located.

17. The electronic device according to claim 14, wherein
the first circuit element and the second circuit element are
    located at different positions in a height direction from
    each other;
the first circuit element is connected to a first surface of
    the dielectric substrate; and
the second circuit element is connected to a second
    surface of the dielectric substrate.

18. The electronic device according to claim 14, wherein
the first circuit element and the second circuit element are
connected through a connector provided on a surface of the
dielectric substrate.

19. The electronic device according to claim 14, wherein
the second circuit element includes a substrate on which at
least one of an integrated circuit (IC) chip and a mount
component is mounted.

\* \* \* \* \*